United States Patent
Zang et al.

(10) Patent No.: US 10,573,753 B1
(45) Date of Patent: Feb. 25, 2020

(54) OXIDE SPACER IN A CONTACT OVER ACTIVE GATE FINFET AND METHOD OF PRODUCTION THEREOF

(71) Applicant: GLOBALFOUNDRIES Inc., Grand Cayman (KY)

(72) Inventors: Hui Zang, Guilderland, NY (US); Laertis Economikos, Wappingers Falls, NY (US); Jiehui Shu, Clifton Park, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/126,775

(22) Filed: Sep. 10, 2018

(51) Int. Cl.
| | | |
|---|---|---|
| H01L 27/088 | (2006.01) | |
| H01L 29/78 | (2006.01) | |
| H01L 29/66 | (2006.01) | |
| H01L 23/532 | (2006.01) | |
| H01L 21/768 | (2006.01) | |
| H01L 21/762 | (2006.01) | |
| H01L 29/06 | (2006.01) | |
| H01L 21/02 | (2006.01) | |
| H01L 29/417 | (2006.01) | |

(52) U.S. Cl.
CPC ...... *H01L 29/785* (2013.01); *H01L 21/02447* (2013.01); *H01L 21/76283* (2013.01); *H01L 21/76832* (2013.01); *H01L 23/5329* (2013.01); *H01L 29/0649* (2013.01); *H01L 29/66545* (2013.01); *H01L 29/66553* (2013.01); *H01L 29/66795* (2013.01); *H01L 29/41783* (2013.01); *H01L 2029/7858* (2013.01)

(58) Field of Classification Search
CPC ............. H01L 21/785; H01L 21/02447; H01L 21/76283; H01L 21/76832; H01L 29/66553; H01L 29/66795
See application file for complete search history.

(56) References Cited

U.S. PATENT DOCUMENTS

| | | | |
|---|---|---|---|
| 6,072,221 A | 6/2000 | Hieda | |
| 6,855,610 B2 | 2/2005 | Tung et al. | |
| 6,884,715 B1 | 4/2005 | Kwon et al. | |
| 9,892,961 B1 * | 2/2018 | Cheng | H01L 21/0217 |
| 10,115,825 B1 * | 10/2018 | Liaw | H01L 29/7848 |
| 2013/0095644 A1 * | 4/2013 | Tu | H01L 21/31053 438/585 |
| 2018/0211875 A1 * | 7/2018 | Basker | H01L 21/76897 |
| 2018/0261507 A1 * | 9/2018 | Jacobi | H01L 21/823456 |

* cited by examiner

*Primary Examiner* — Phuc T Dang
(74) *Attorney, Agent, or Firm* — Ditthavong & Steiner P.C.

(57) ABSTRACT

A device including oxide spacer in a contact over active gates (COAG) and method of production thereof. Embodiments include first gate structures over a fin of a substrate and second gate structures, each over an outer portion of the fin and a shallow trench isolation (STI) layer adjacent to the fin; a first raised source/drain (RSD) in a portion of the fin between the first gate structures and a second RSD in the portion of the fin between the first and second gate structures; a metal liner over the first and second RSD and on sidewall portions of the first and second gate structures; a metal layer over the metal liner; and an interlayer dielectric (ILD) over the metal liner and portions of the first and second gate structures.

16 Claims, 26 Drawing Sheets

OXIDE SPACER IN A CONTACT OVER ACTIVE GATE FINFET AND METHOD OF PRODUCTION THEREOF

TECHNICAL FIELD

The present disclosure relates to semiconductor devices, such as integrated circuits (ICs). The present disclosure is particularly applicable to forming an oxide spacer in a contact over active gates (COAG) of fin field-effect transistor (finFET) in the 7 nanometer (nm) technology node and beyond.

BACKGROUND

There is an increasing demand for smaller semiconductor devices with increased memory, computational power, and speed. However, continuous scaling down dimensions of semiconductor devices increases density, and the conventional fabrication techniques involve contacting a portion of a gate electrode over an isolation region, which wastes layout space and adversely affects density. One of the problems with tight dimensional requirements of the semiconductor device is the parasitic capacitance during pillar for gate (PC) and lower S/D contact containing trench silicide (TS) reduction. Another challenge is to improve the design and method of forming contacts directly over the functional portion of a gate to improve device density, e.g., around 10% area scaling is achievable with COAG.

A need, therefore, exists for scaled-down devices with an oxide spacer in a COAG for efficient enabling methodology.

SUMMARY

An aspect of the present disclosure is a scaled-down semiconductor device with an oxide spacer in a COAG.

Another aspect of the present disclosure is a method of fabricating a scaled-down semiconductor device with an oxide spacer in a COAG.

According to the present disclosure, some technical effects may be achieved in part by a device including: first gate structures over a fin of a substrate and second gate structures, each over an outer portion of the fin and a shallow trench isolation (STI) layer adjacent to the fin; a first raised source/drain (RSD) in a portion of the fin between the first gate structures and a second RSD in the portion of the fin between the first and second gate structures; a metal liner over the first and second RSD and on sidewall portions of the first and second gate structures; a metal layer over the metal liner; and an interlayer dielectric (ILD) over the metal liner and portions of the first and second gate structures.

Another aspect of the present disclosure is a method including: forming first gate structures over a fin of a substrate and second gate structures, each over an outer portion of the fin and a STI layer adjacent to the fin; forming a first RSD in a portion of the fin between the first gate structures and a second RSD in the portion of the fin between the first and second gate structures; forming a metal liner over the first and second RSD and on sidewall portions of the first and second gate structures; forming a metal layer over the metal liner; and forming an ILD over the metal liner and portions of the first and second gate structures.

A further aspect of the present disclosure is a device including: first gate structures over a fin of a substrate and second gate structures, each over an outer portion of the fin and a STI layer adjacent to the fin; a first RSD in a portion of the fin between the first gate structures and a second RSD in the portion of the fin between the first and second gate structures; a metal liner formed to a thickness of 1 nm to 15 nm over the first and second RSD and on sidewall portions of the first and second gate structures; a metal layer comprising cobalt (Co), tungsten (W) or aluminum (Al) and formed to a thickness of 5 nm to 100 nm over the metal liner; and an ILD formed to a thickness of 10 nm to 30 nm over the metal liner and portions of the first and second gate structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of parasitic capacitance during PC and TS reduction attendant upon scaling down dimensions of semiconductor devices. The problem is solved, inter alia, by forming an oxide spacer in a COAG.

Methodology in accordance with embodiments of the present disclosure includes providing first gate structures over a fin of a substrate and second gate structures, each over an outer portion of the fin and a STI layer adjacent to the fin. A first RSD in a portion of the fin between the first gate structures and a second RSD in the portion of the fin between the first and second gate structures. A metal liner over the first and second RSD and on sidewall portions of the first and second gate structures. A metal layer over the metal liner, and an ILD over the metal liner and portions of the first and second gate structures.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
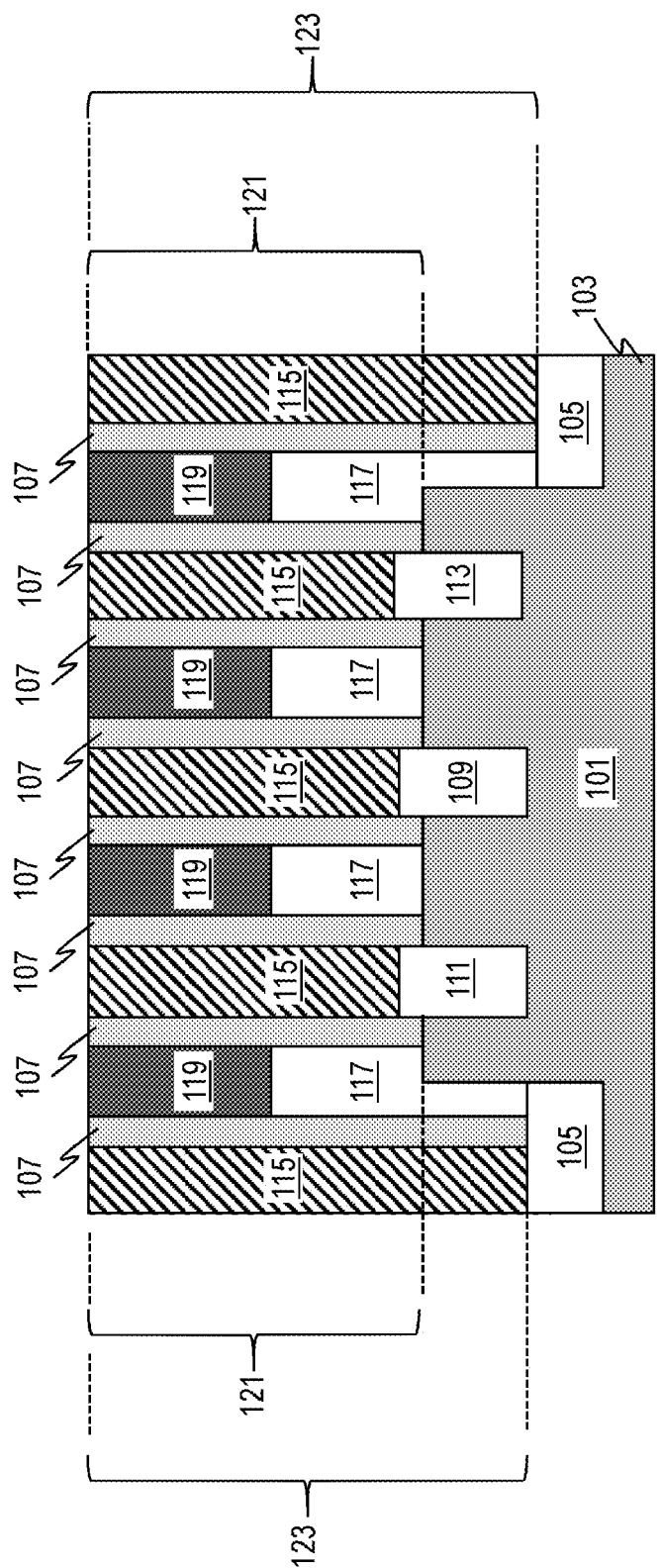
FIGS. 1 through 13 schematically illustrate cross-sectional views of a process flow for forming CA and CB over the sidewall spacers and oxide spacer in a COAG, in accordance with an exemplary embodiment.

FIGS. 1 through 13 schematically illustrate cross-sectional views of a process flow for forming CA and CB over the sidewall spacers and oxide spacer in a COAG, in accordance with an exemplary embodiment. Referring to FIG. 1, first dummy gates (not shown for illustrative convenience) are formed, laterally separated, over a portion of the fin 101 of the substrate 103, and second dummy gates (not shown for illustrative convenience) are formed, laterally separated, over an outer portion of the fin 101 and the STI layer 105 adjacent to the fin 101. In one instance, STI layer 105 includes silicon dioxide ($SiO_2$) or a similar material. Thereafter, sidewall spacers 107 are formed, e.g., of silicon oxycarbonitride (SiOCN), $SiO_2$, silicon nitride (SiN), silicon carbonitride (SiCN), silicon oxycarbide (SiOC), siliconborocarbonitride (SiBCN), or a similar material, on the sidewalls of the first dummy gates and the second dummy gates to a width, e.g., of about 1 nm to about 20 nm, by chemical vapor deposition (CVD). Next, RSD 109 is formed in a portion of the fin 101 between the first dummy gates, and RSD 111 and 113 are formed in a portion of the fin 101 between first dummy gates and second dummy gates. In one instance, RSD 109, 111 and 113 includes epitaxial (EPI) material, wherein EPI material for an NFET RSD is silicon-phosphorus (SiP) by a P-type doping and for a PFET RSD is silicon germanium (SiGe) by a B-type doping. Subsequently, an ILD 115 is formed, e.g., of oxide, hydrogenated oxidized silicon carbon (SiCOH), $SiO_2$, SiOC, SiN or a similar material, over substrate 103, and is planarized down to the sidewall spacers 107. Then, the first dummy gates and the second dummy gates are removed. Thereafter, a HKMG layer 117 is formed, e.g., as to a thickness of about 1 nm to about 30 nm, between and along a portion of the sidewall spacers 107. Pursuant to this, a cap layer is formed, e.g., of SiN, SiCN, SiOCN, SiOC or a similar material, over HKMG layer 117, sidewall spacers 107 and ILD 115 to a thickness, e.g., of about 1 nm to about 30 nm. Then, the cap layer is planarized down to sidewall spacers 107, forming cap layer 119. In one instance, HKMG layer 117, cap layer 119, and sidewall spacers 107 between RSD 109 and RSD 111 and 113 form the first gate structures 121. In another instance, HKMG layer 117, cap layer 119, and sidewall spacers 107 over an outer portion of fin 101 and STI layer 105 form second gate structures 123.

Figure 2:
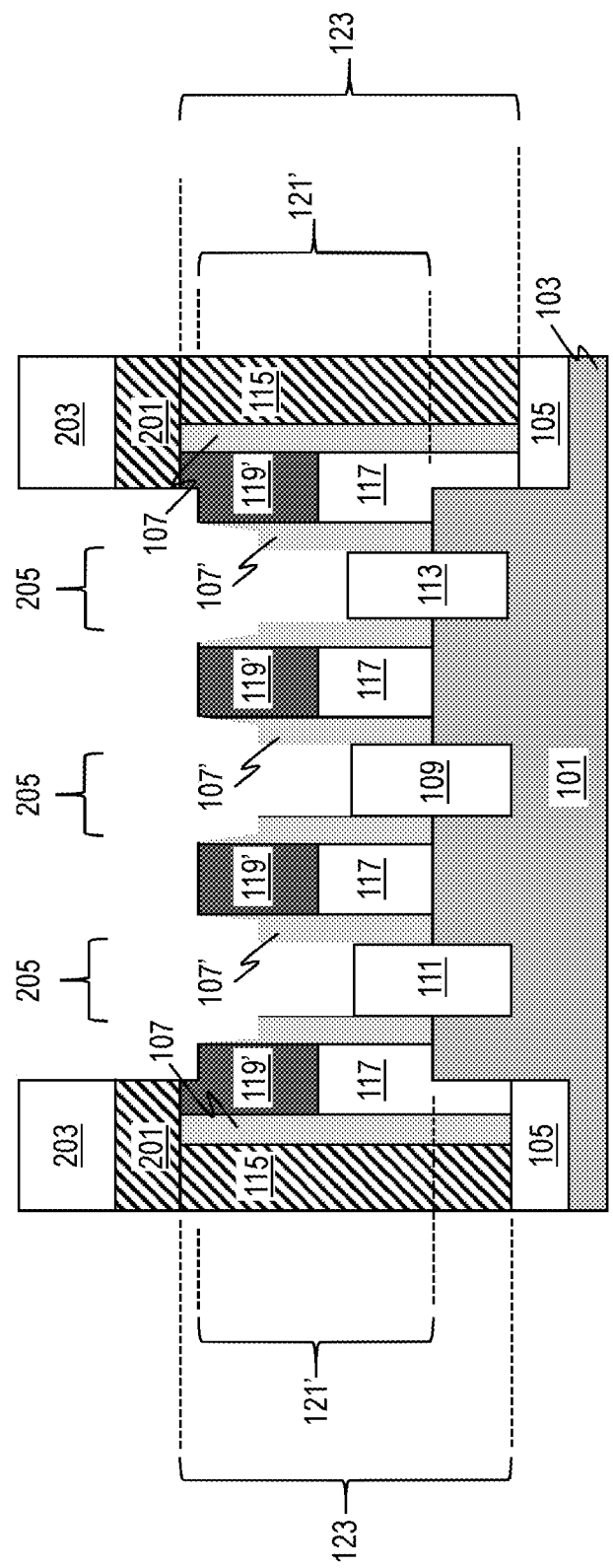
Figure 3:
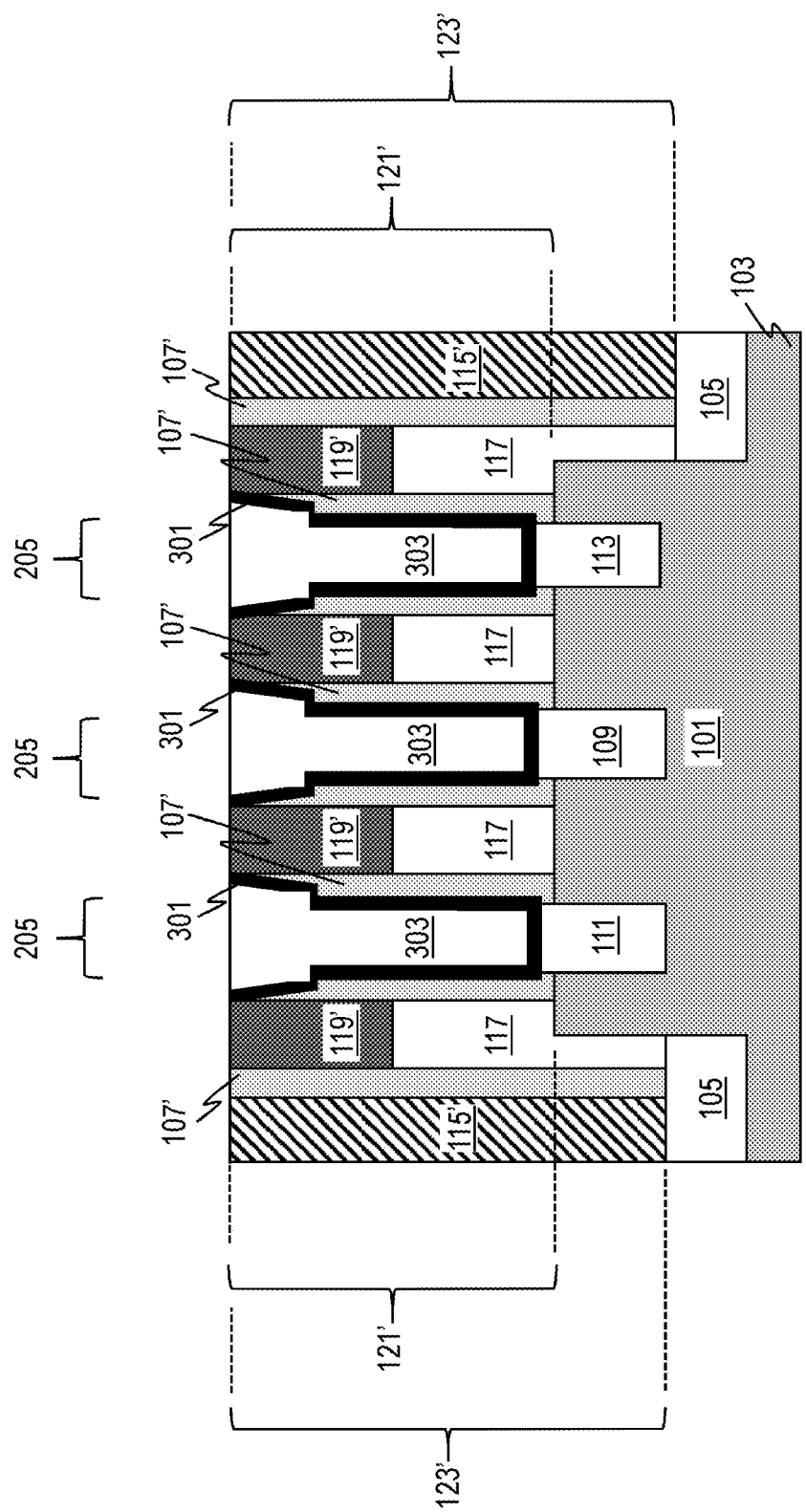

As illustrated in FIG. 2, an ILD 201 is formed over ILD 115 and portions of second gate structure 123. Then, an organic planarizing layer (OPL) 203 is formed over ILD 201. Thereafter, ILD 115 over RSD 109, 111 and 113, and portions of cap layer 119 and sidewall spacers 107 adjacent to the RSD 109, 111 and 113 are removed, e.g., as etching, such as reactive ion etching (ME), forming trenches 205, sidewall spacers 107', cap layer 119' and first gate structures 121'. Referring to FIG. 3, OPL 203 and ILD 201 are removed. Then, ILD 115, sidewall spacers 107 and portions of cap layer 119' over STI layer 105 are planarized down to the level of first gate structures 121', thereby forming second gate structures 123' and ILD 115'. Thereafter, a metal liner 301 is formed, e.g., of titanium (Ti), titanium nitride (TiN) or a similar material, as to a thickness, e.g., of about 1 nm to about 15 nm, in trenches 205. Subsequently, a metal layer 303 is formed, e.g., of Co, tungsten (W), aluminum (Al) or a similar material, to a thickness, e.g., of about 5 nm to about 100 nm, over metal liner 301. In this instance, the upper surface of metal layer 303 is substantially coplanar to the upper surface of first gate structures 121' and second gate structures 123'.

Figure 4:
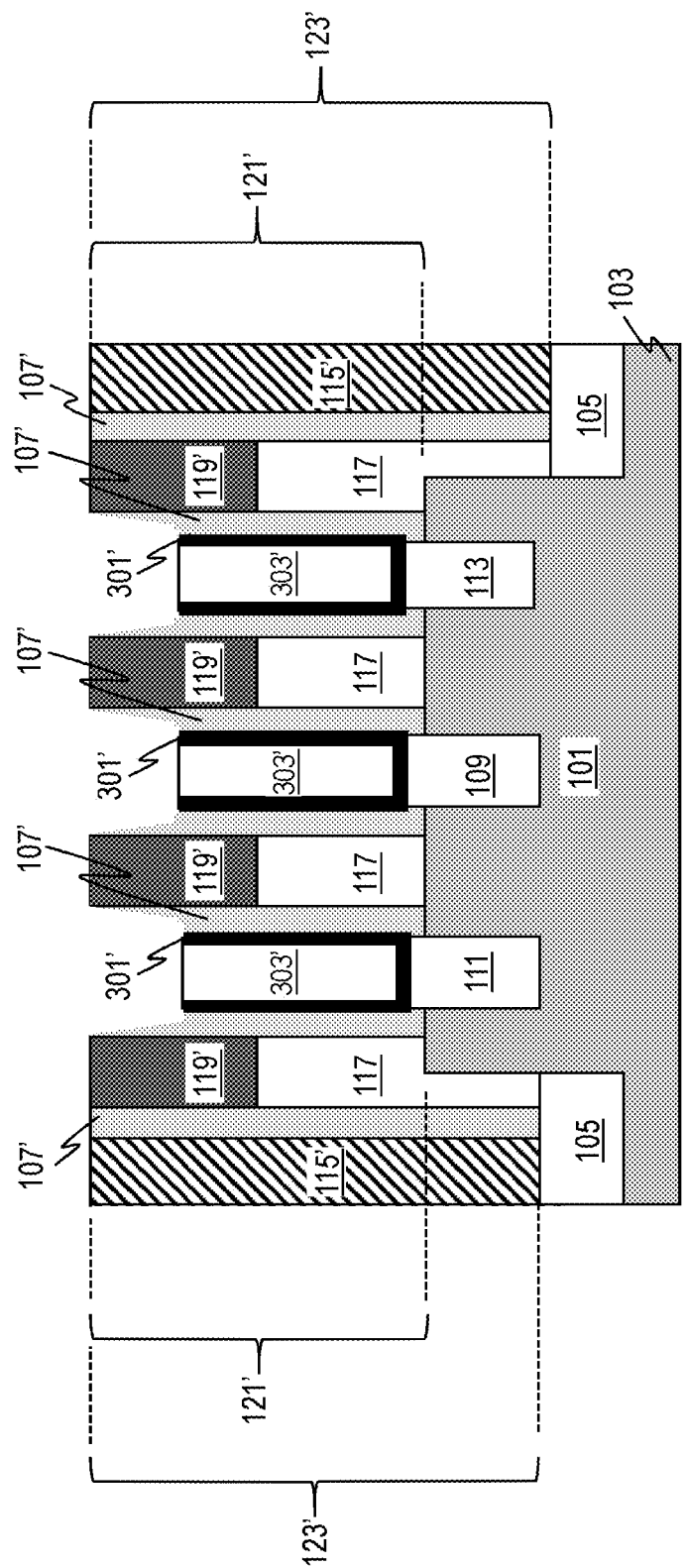
Figure 5:
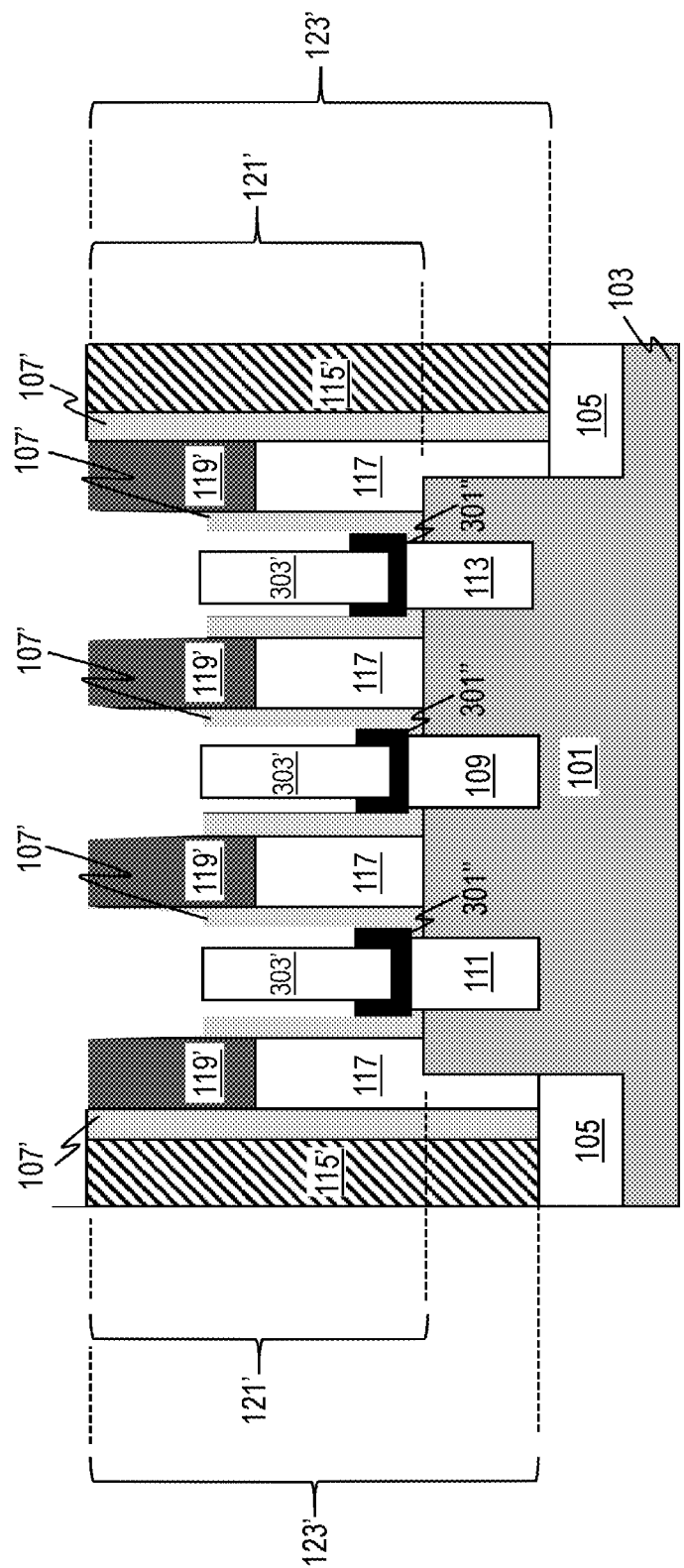
Figure 6:
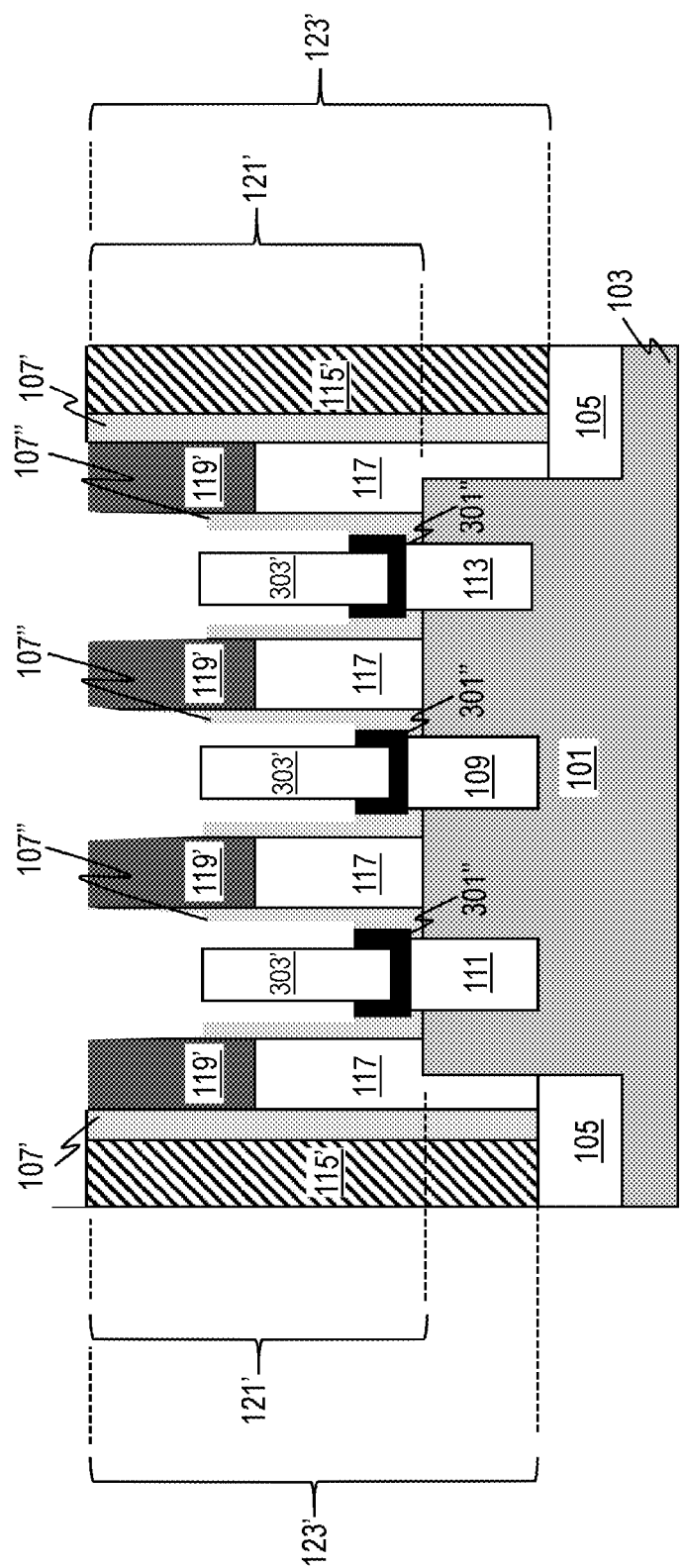

Next, as shown in FIG. 4, metal liner 301 and metal layer 303 are recessed as by etching, e.g., RIE or wet etching, forming metal liner 301' and metal layer 303'. The metal liner 301' is further recessed as by etching, e.g., RIE or wet etching, forming metal liner 301", as depicted in FIG. 5. Subsequently, sidewall spacer 107' adjacent to RSD 109, 111 and 113 is thinned, e.g., to a thickness of about 1 nm to about 6 nm by etching, forming sidewall spacers 107", as illustrated in FIG. 6.

Figure 7:
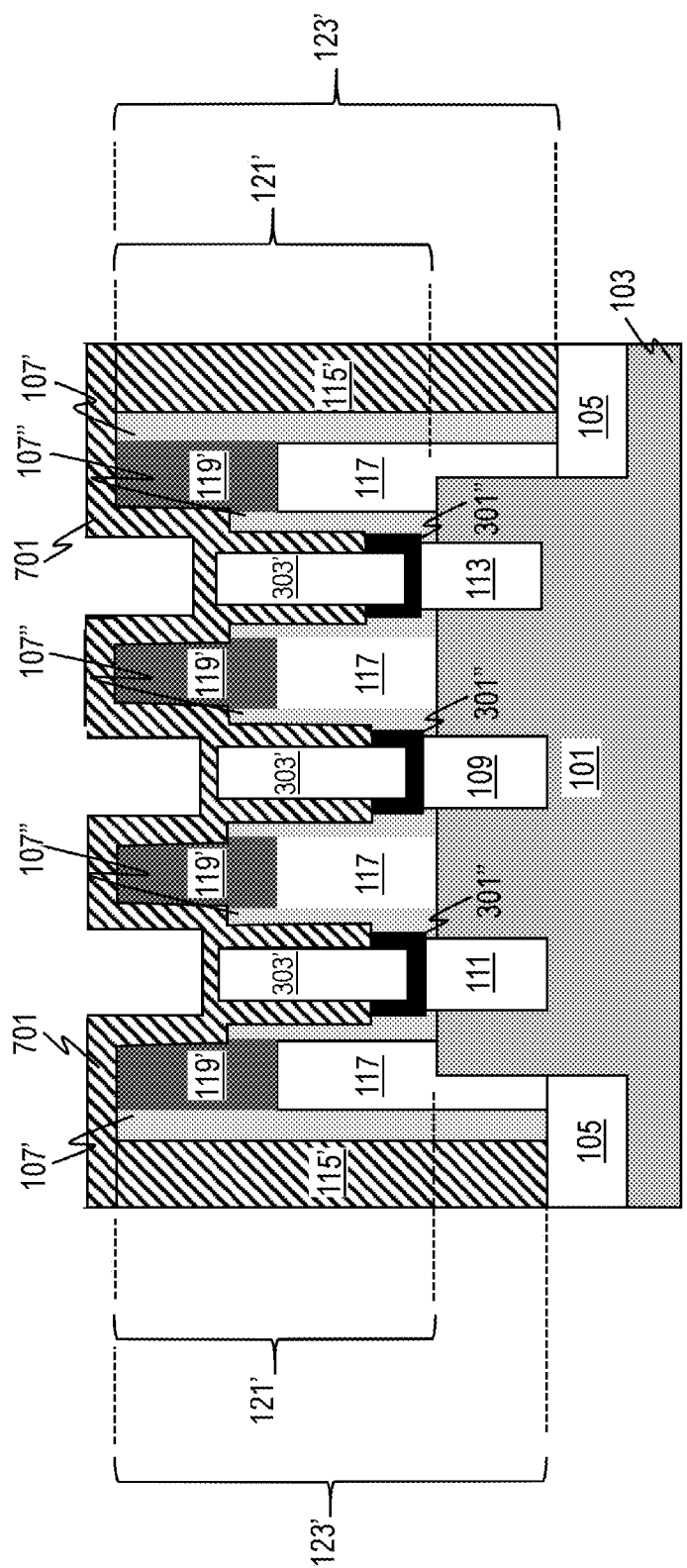
Figure 8:
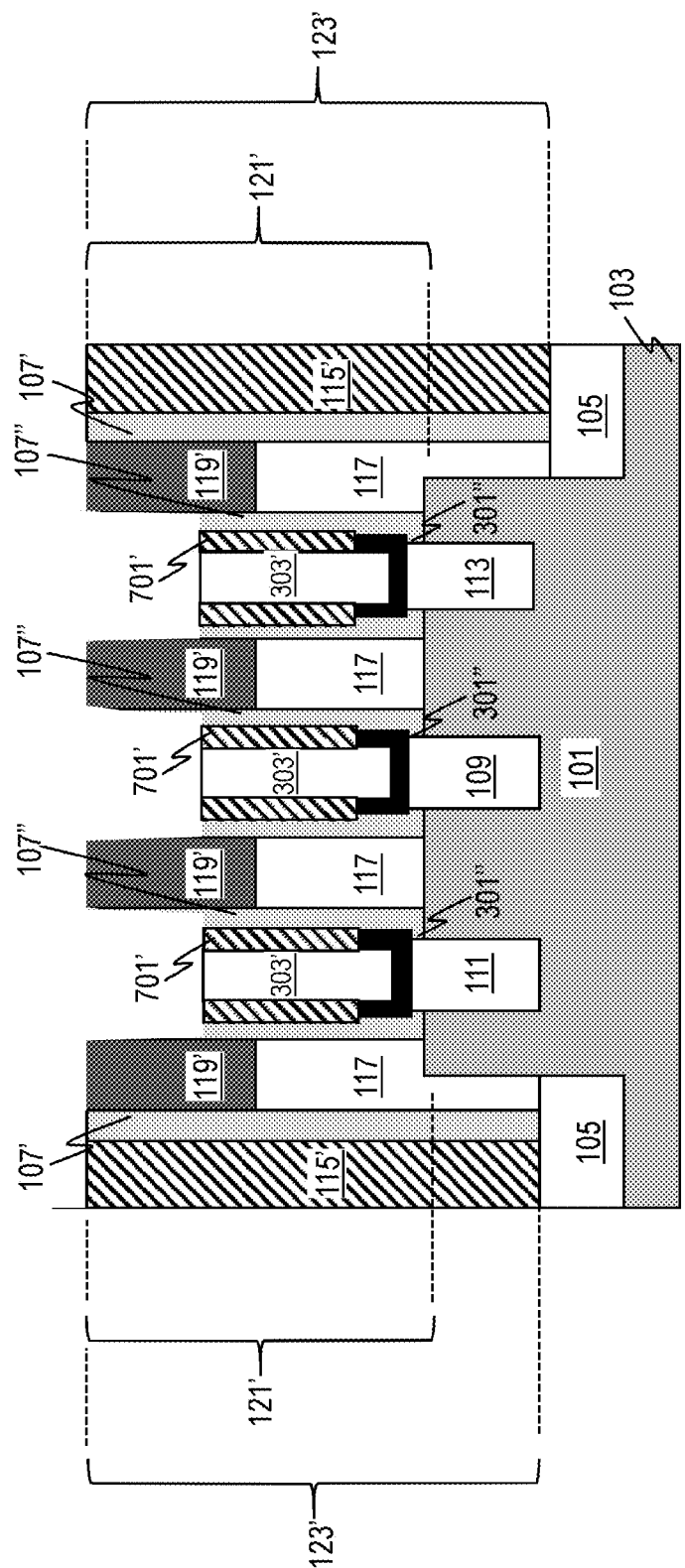
Figure 9:
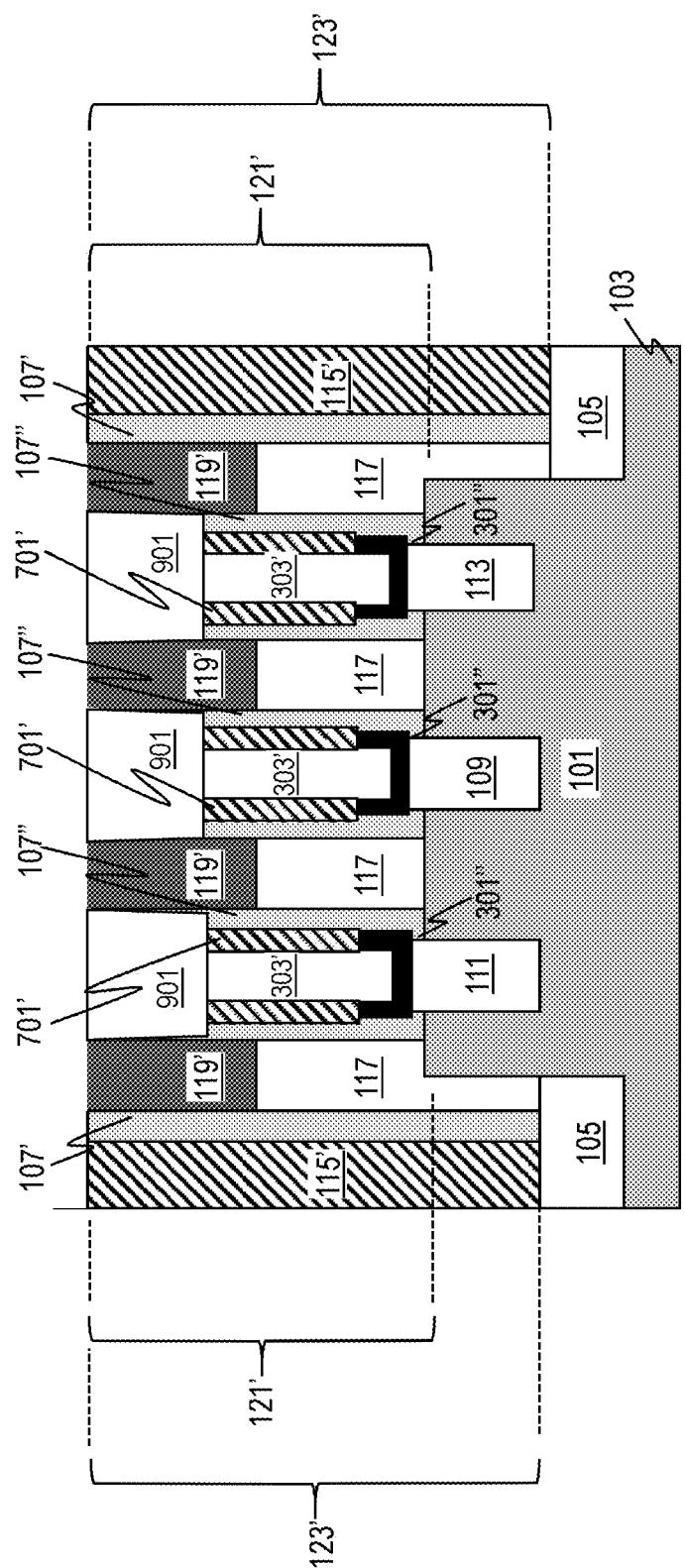

Referring to FIG. 7, an ILD 701 is conformally formed, e.g., of oxide, SiCOH, $SiO_2$, SiOC, SiN or a similar material, to a thickness, e.g., of about 5 nm to about 30 nm, over the substrate 103. Thereafter, portions of ILD 701 is removed, e.g., by an isotropic etching process, forming ILD 701' between the sidewall spacer 107" and the metal layer 303', as depicted in FIG. 8. Subsequently, as shown in FIG. 9, a silicon carbide (SiC) layer 901 is formed over sidewall spacers 107", ILD 701' and metal layer 303', such that the upper surface of SiC layer 901 is substantially coplanar with the upper surface of first gate structures 121' and second gate structures 123'.

Figure 10:
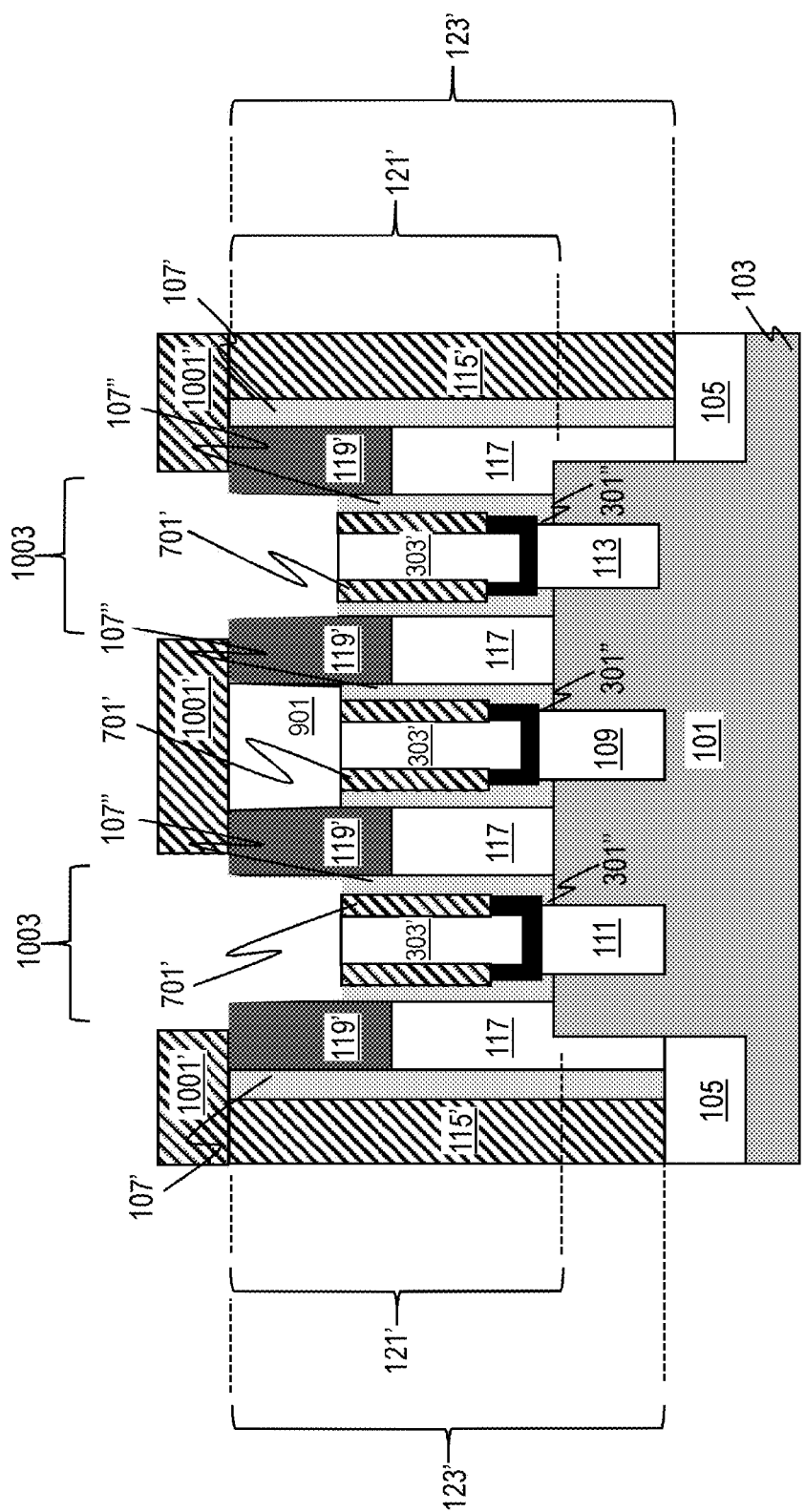

As shown in FIG. 10, an ILD 1001 is formed over substrate 103. Subsequently, ILD 1001 is patterned, as by etching to expose SiC layer 901 over RSD 111 and 113, forming ILD 1001'. This is followed by removing the exposed SiC layer 901 over RSD 111 and 113, forming trenches 1003. Then, in FIG. 12, the trenches 1003 are filled with metal layer 1201, e.g., Co, W or Ru, forming a CA to RSD 111 and 113. The upper surface of the metal layer 1201 is substantially coplanar to the upper surface of the ILD 1001'.

Figure 11:
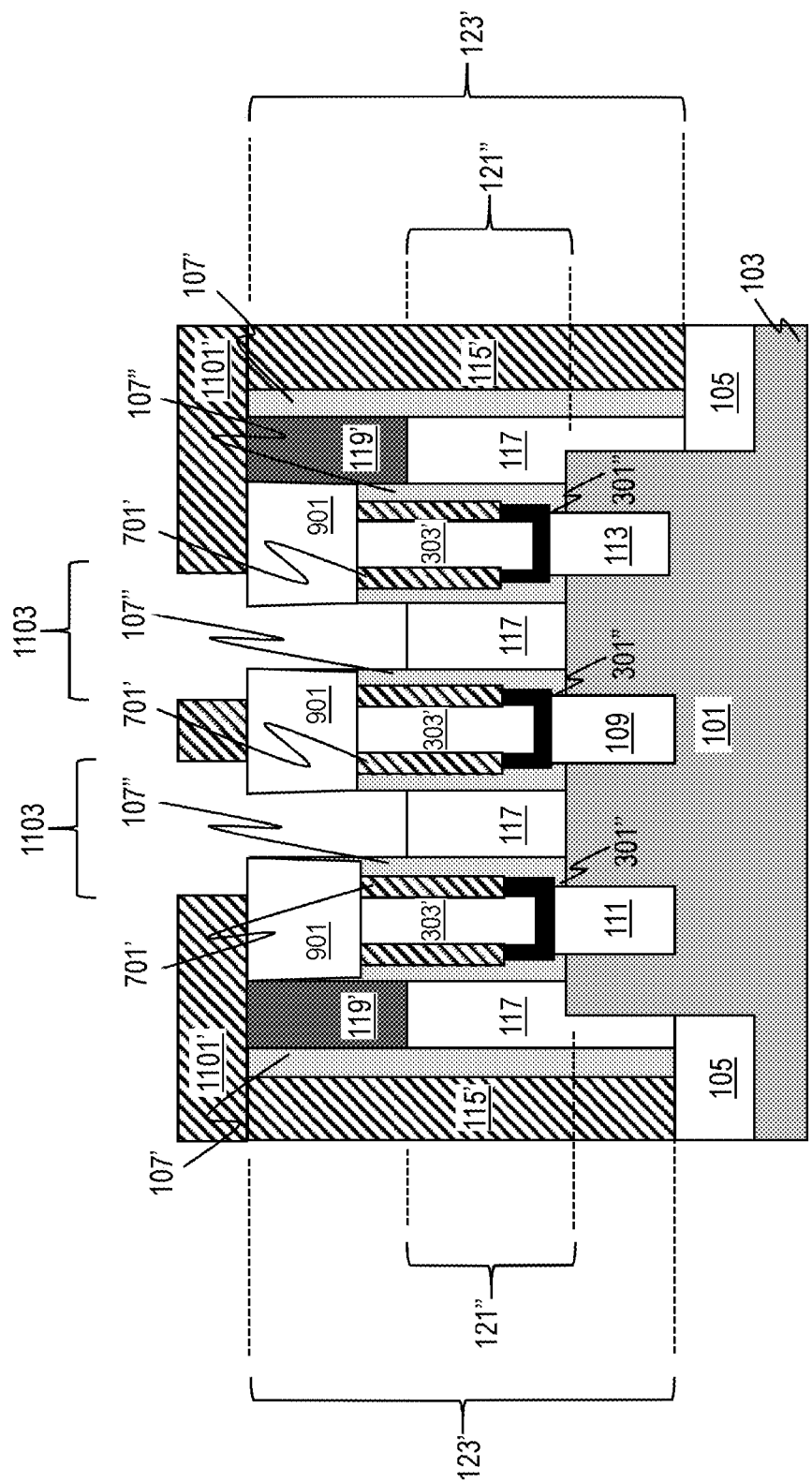
Figure 12:
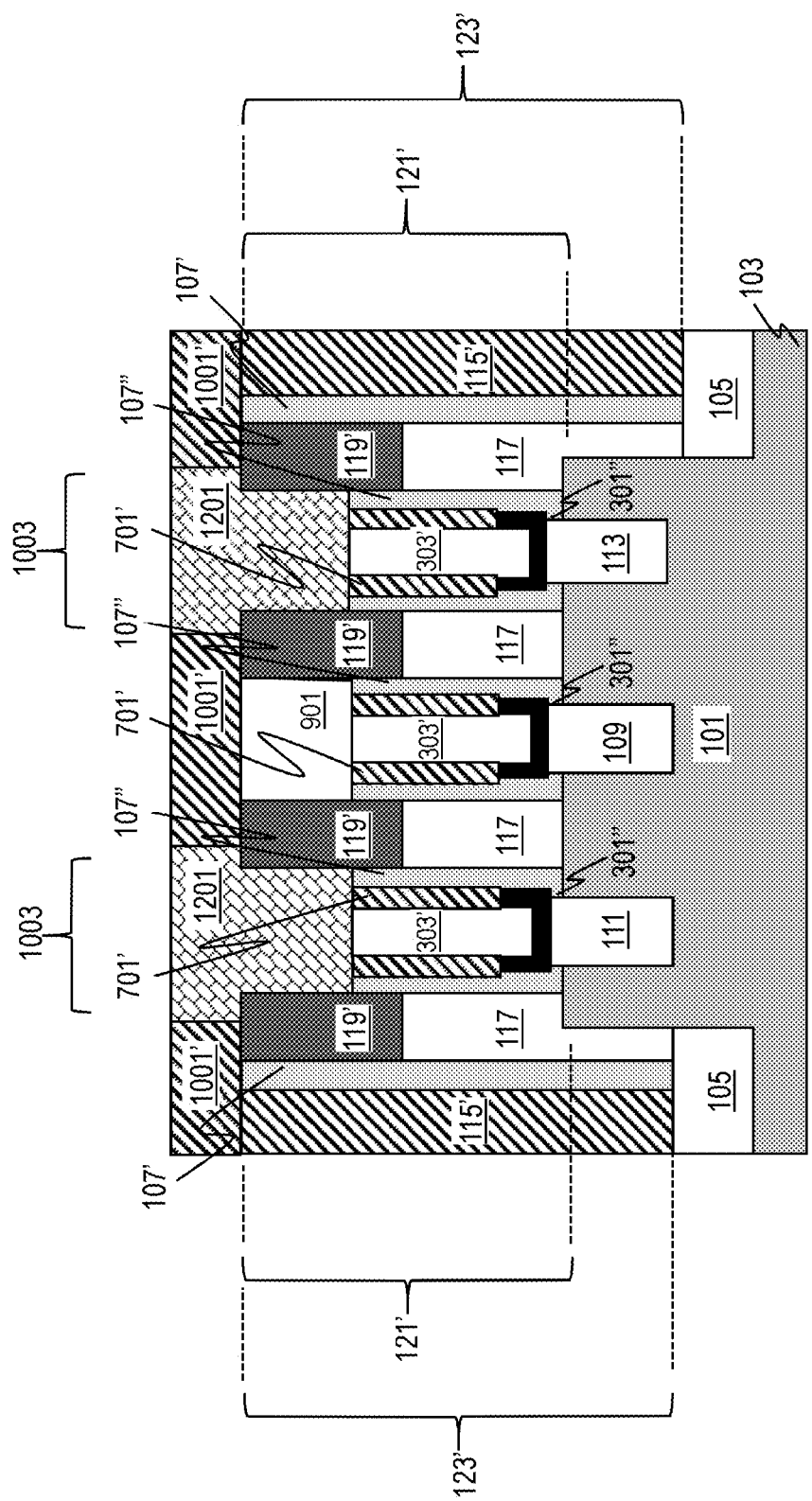
Figure 13:
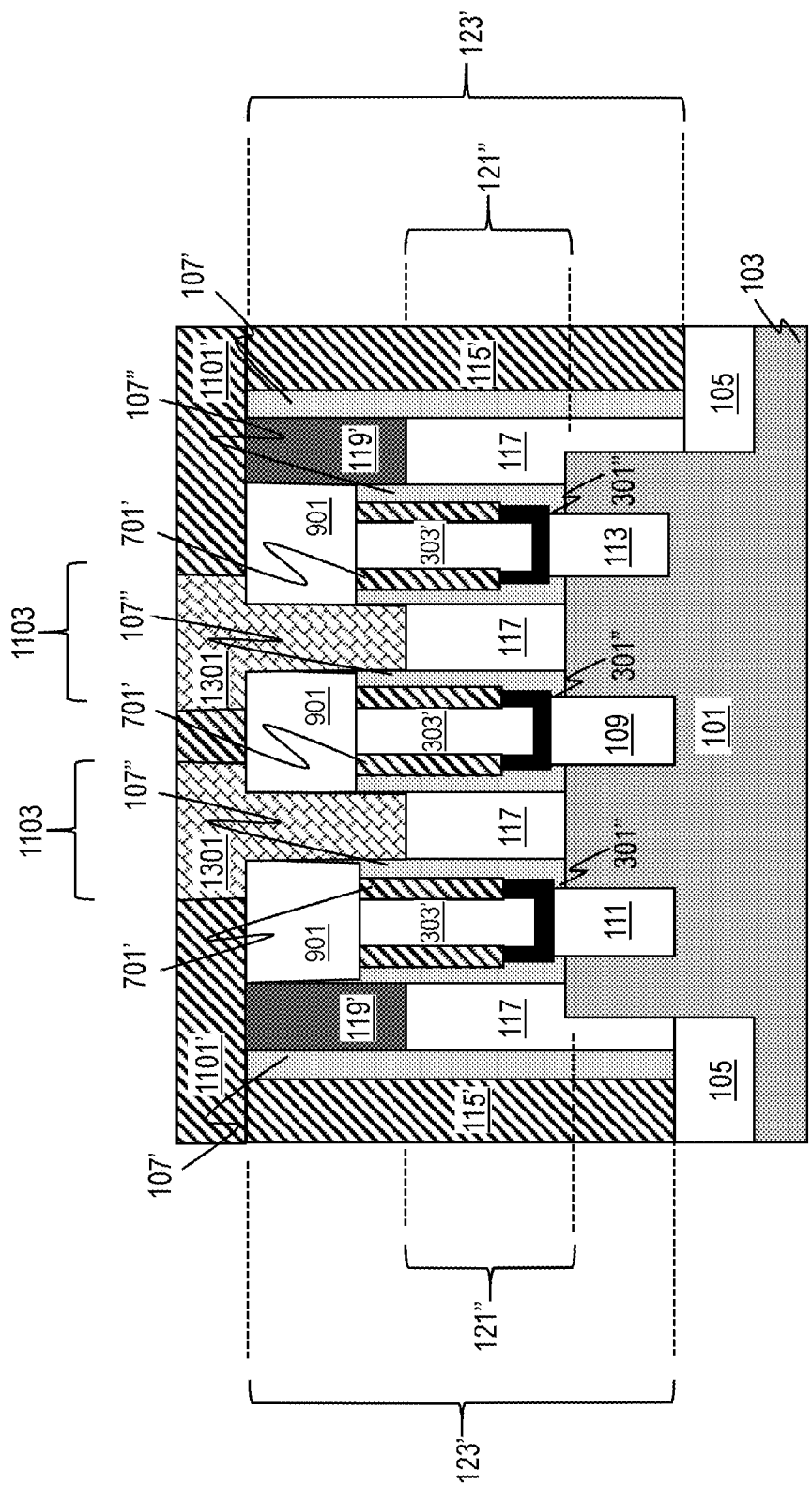

As shown in FIG. 11, an ILD 1101 is formed over substrate 103. ILD 1101 is subsequently etched exposing first gate structures 121', forming ILD 1101'. Subsequently, cap layer 119' of first gate structures 121' is removed, forming trenches 1103 and first gate structures 121". Subsequently, as shown in FIG. 13, trenches 1103 are filled with metal layer 1301, e.g., Co, W or Ru, forming a CB to gate structures 121". The upper surface of metal layer 1301 is substantially coplanar to the upper surface of the ILD 1101'. In such manner, ILD 701' is formed in a COAG.

Figure 14:
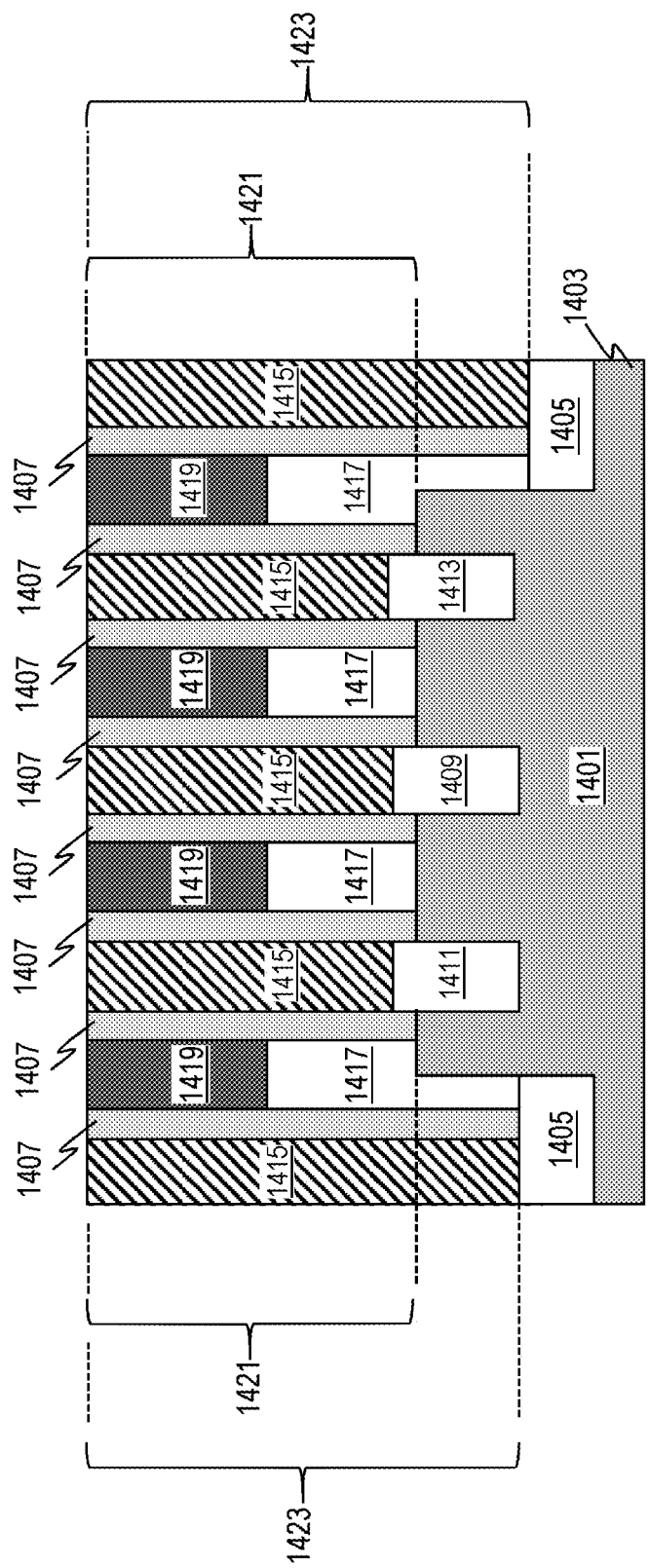
FIGS. 14 through 26 schematically illustrate cross-sectional views of a process flow for forming CA and CB over the oxide spacer in a COAG, in accordance with an exemplary embodiment.

FIGS. 14 through 26 schematically illustrate cross-sectional views of a process flow for forming CA and CB over the oxide spacer in a COAG, in accordance with an exemplary embodiment. Referring to FIG. 14, similar to the process steps described with respect to FIG. 1 above, first dummy gates (not shown for illustrative convenience) are formed, laterally separated, over a portion of the fin 1401 of the substrate 1403, and second dummy gates (not shown for illustrative convenience) are formed, laterally separated, over an outer portion of the fin 1401 and the STI layer 1405 adjacent to the fin 1401. In one instance, STI layer 1405 includes an insulating layer such as $SiO_2$ or a similar material. Thereafter, sidewall spacers 1407 are formed, e.g., of SiOCN, $SiO_2$, SiN, SiCN, SiOC or a similar material, on the sidewalls of the first dummy gates and the second dummy gates as to a width, e.g., of about 1 nm to about 20 nm, by CVD. Subsequently, RSD 1409 is formed in a portion of fin 1401 between the first dummy gates, and RSD 1411 and RSD 1413 are formed in a portion of fin 1401 between the first dummy gates and the second dummy gates. In one instance, RSDs 1409, 1411 and 1413 include an EPI material, wherein the EPI material for an NFET RSD is SiP by P-type doping, and for a PFET RSD is SiGe by B-type doping. Subsequently, an ILD 1415 is formed, e.g., of oxide, SiCOH, SiO$_2$, SiOC, SiN, or a similar material, over substrate 1403, and planarized down to sidewall spacers 1407. Subsequently, the first dummy gates and the second dummy gates are removed. Thereafter, a HKMG layer 1417 is formed, e.g., to a thickness of about 1 nm to about 30 nm, between and along a portion of sidewall spacers 1407. A cap layer is formed, e.g., of SiN, SiCN, SiOCN, SiOC or a similar material, over HKMG layer 1417, sidewall spacers 1407 and ILD 1415 to a thickness, e.g., of about 1 nm to about 30 nm. The cap layer is planarized down to sidewall spacers 1407, forming cap layer 1419. In one instance, HKMG layer 1417, cap layer 1419, and sidewall spacers 1407 between RSD 1409, RSD 1411, and RSD 1413 form the first gate structures 1421. In another instance, HKMG layer 1417, cap layer 1419, and sidewall spacers 1407 over an outer portion of fin 1401 and STI layer 1405 forms second gate structures 1423.

Figure 15:
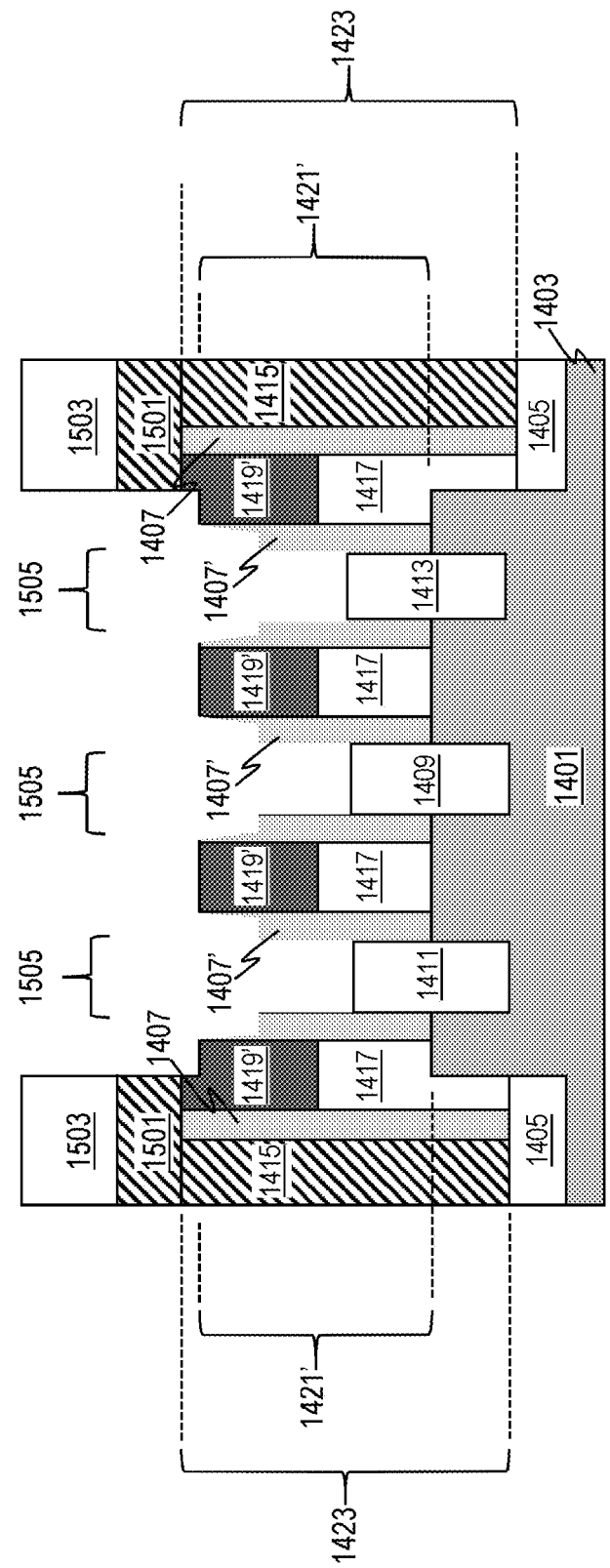
Figure 16:
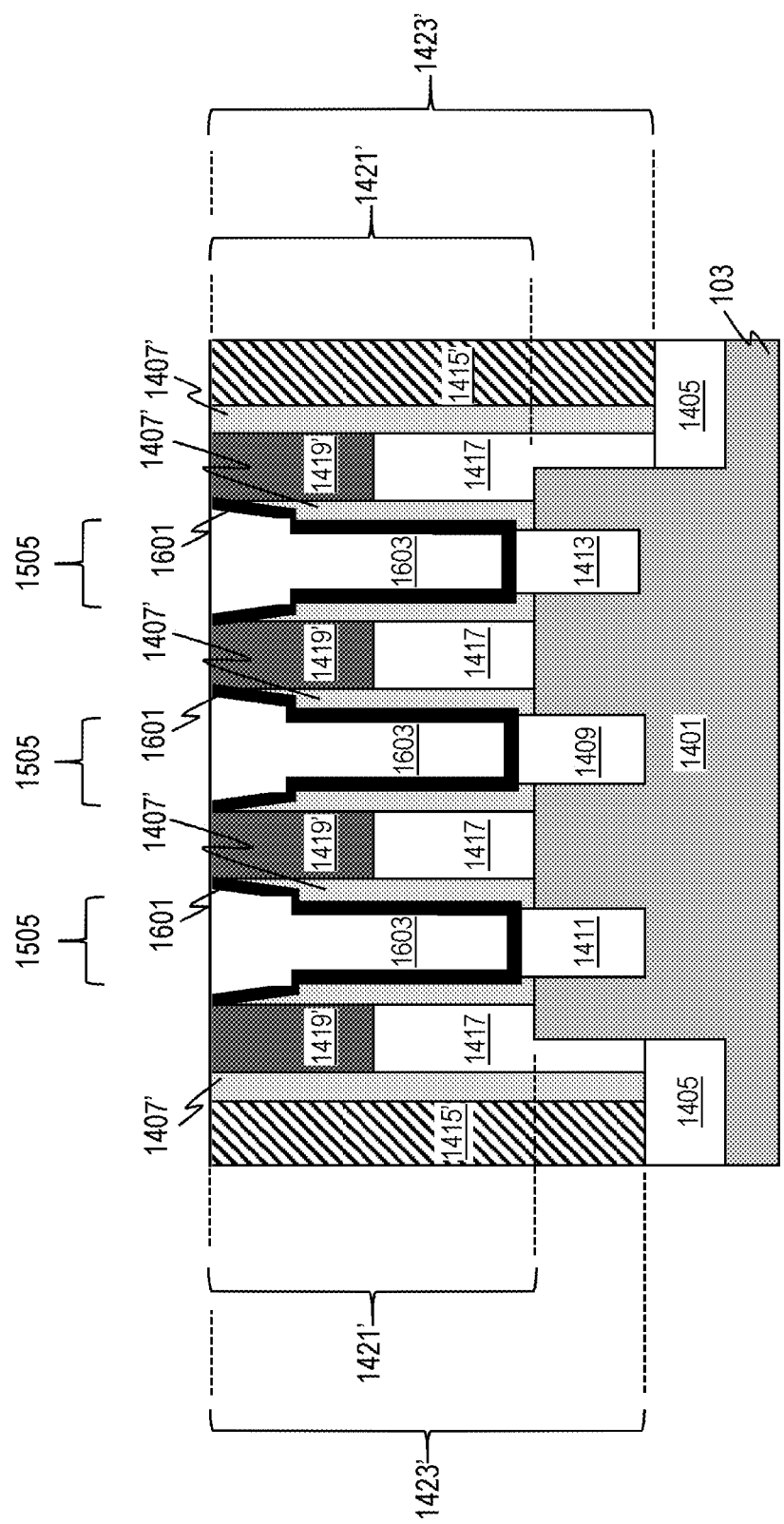

As illustrated in FIG. 15, an ILD 1501 is formed over ILD 1415 and portions of second gate structure 1423. Subsequently, an OPL 1503 is formed over ILD 1501. Thereafter, ILD 1415 over the RSDs 1409, 1411, and 1413, and portions of cap layer 1419 and sidewall spacers 1407 adjacent to the RSDs 1409, 1411, and 1413 are removed, as by etching, e.g., by RIE, forming trenches 1505, sidewall spacers 1407', cap layer 1419', and first gate structures 1421'. Referring to FIG. 16, OPL 1503 and ILD 1501 are removed. Subsequently, ILD 1415, sidewall spacers 1407, and portions of cap layer 1419' over STI layer 1405 are planarized down to the level of first gate structures 1421', thereby forming second gate structures 1423' and ILD 1415'. Thereafter, a metal liner 1601 is formed, e.g., of Ti, TiN or a similar material, as to a thickness, e.g., of about 1 nm to about 15 nm in the trenches 1505. Subsequently, a metal layer 1603 is formed, e.g., of Co, W or a similar material, to a thickness, e.g., of about 5 nm to about 100 nm, over metal liner 1601. In this instance, the upper surface of metal layer 1603 is substantially coplanar with the upper surface of first gate structures 1421' and second gate structures 1423'.

Figure 17:
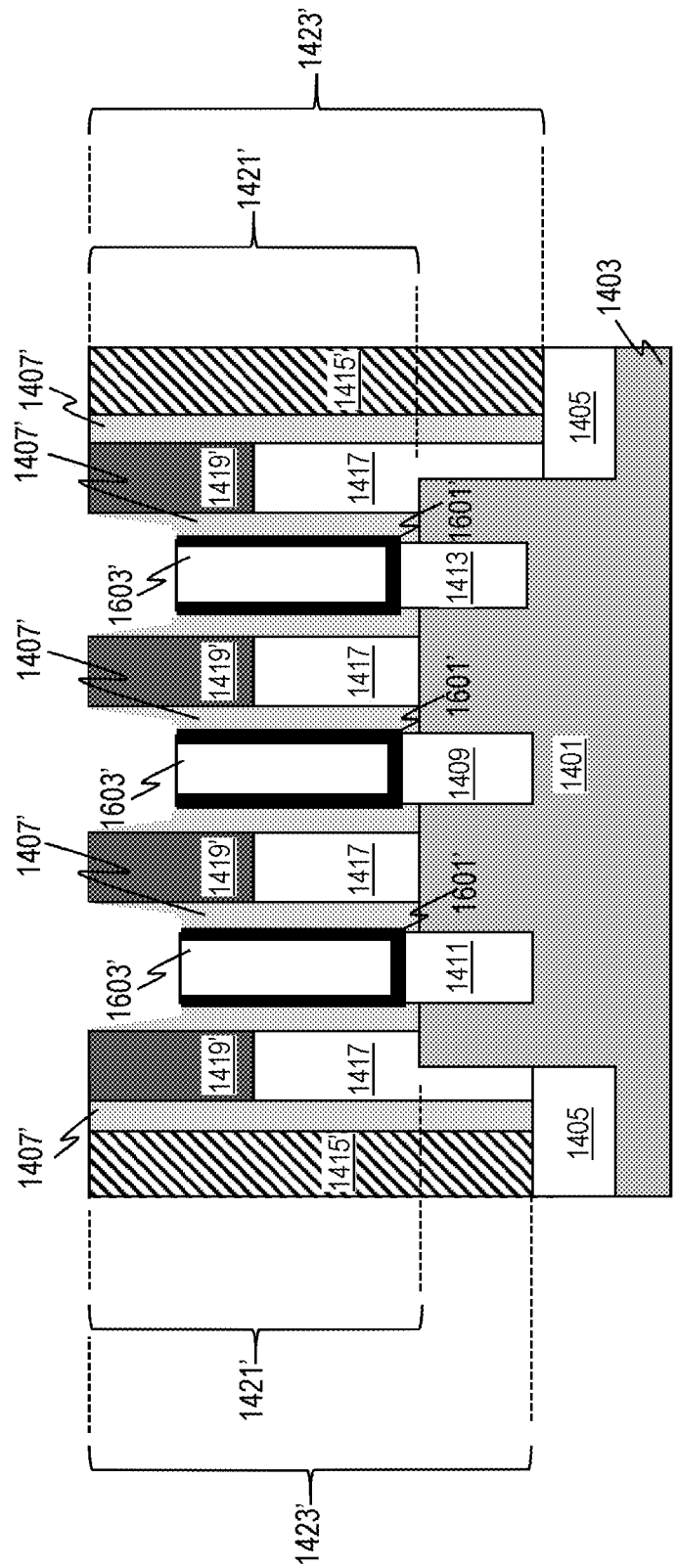
Figure 18:
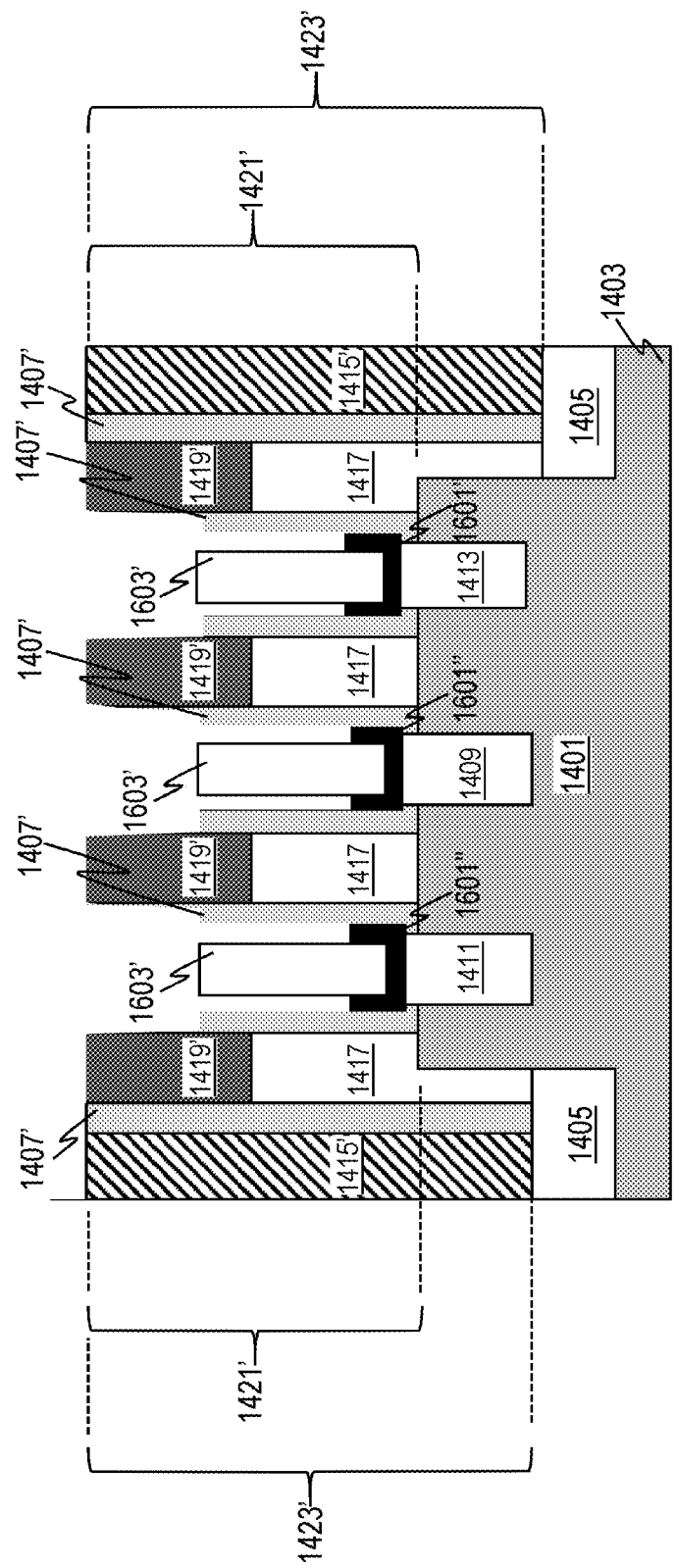
Figure 19:
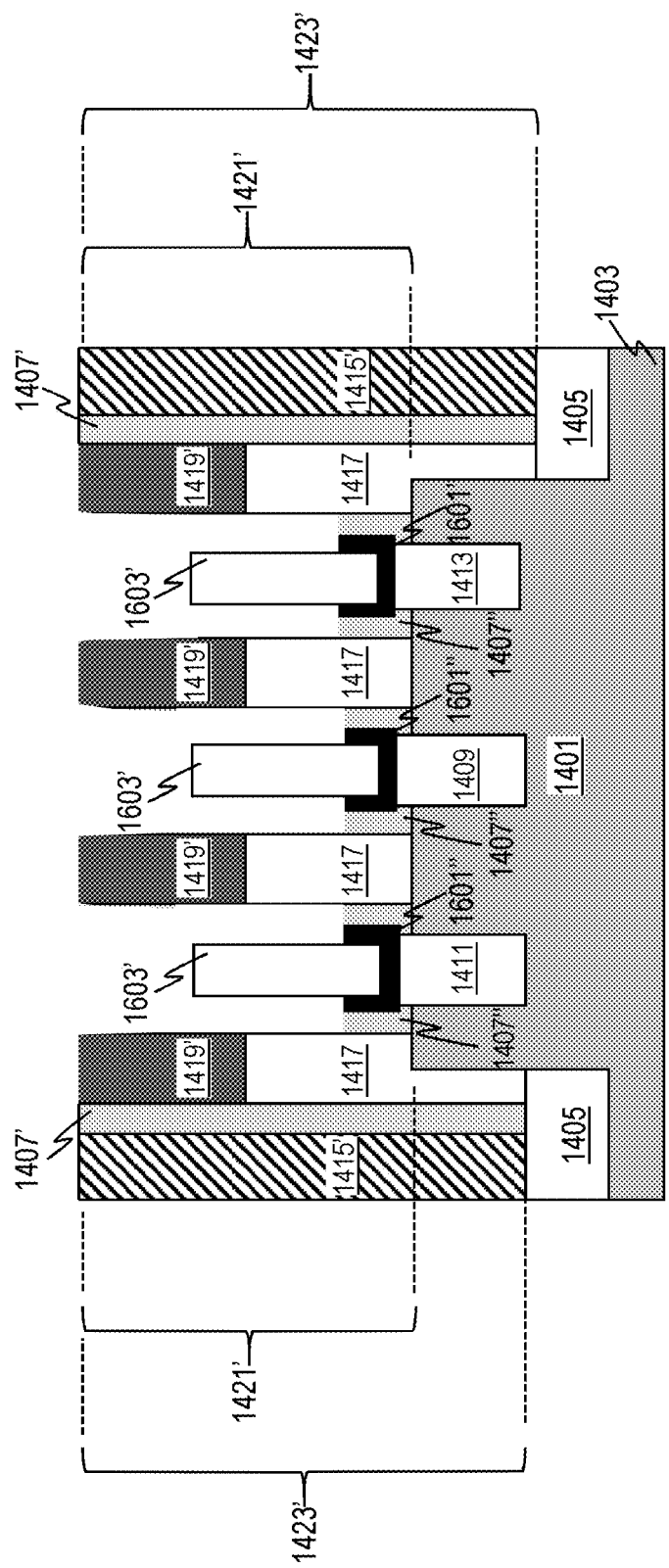

Next, in FIG. 17, the metal liner 1601 and metal layer 1603 are recessed, e.g., by ME, wet etch or any other etching processes, forming metal liner 1601' and metal layer 1603'. The metal liner 1601' is further recessed, e.g., by ME, wet etch or any other etching processes, forming metal liner 1601", as depicted in FIG. 18. Subsequently, sidewall spacer 1407' adjacent to the RSD 109, 111 and 113 is recessed, e.g., by ME, wet etch or any other etching processes, forming sidewall spacers 1407", as illustrated in FIG. 19. In this instance, the upper surface of sidewall spacers 1407" is substantially coplanar to the upper surface of the metal liner 1601".

Figure 20:
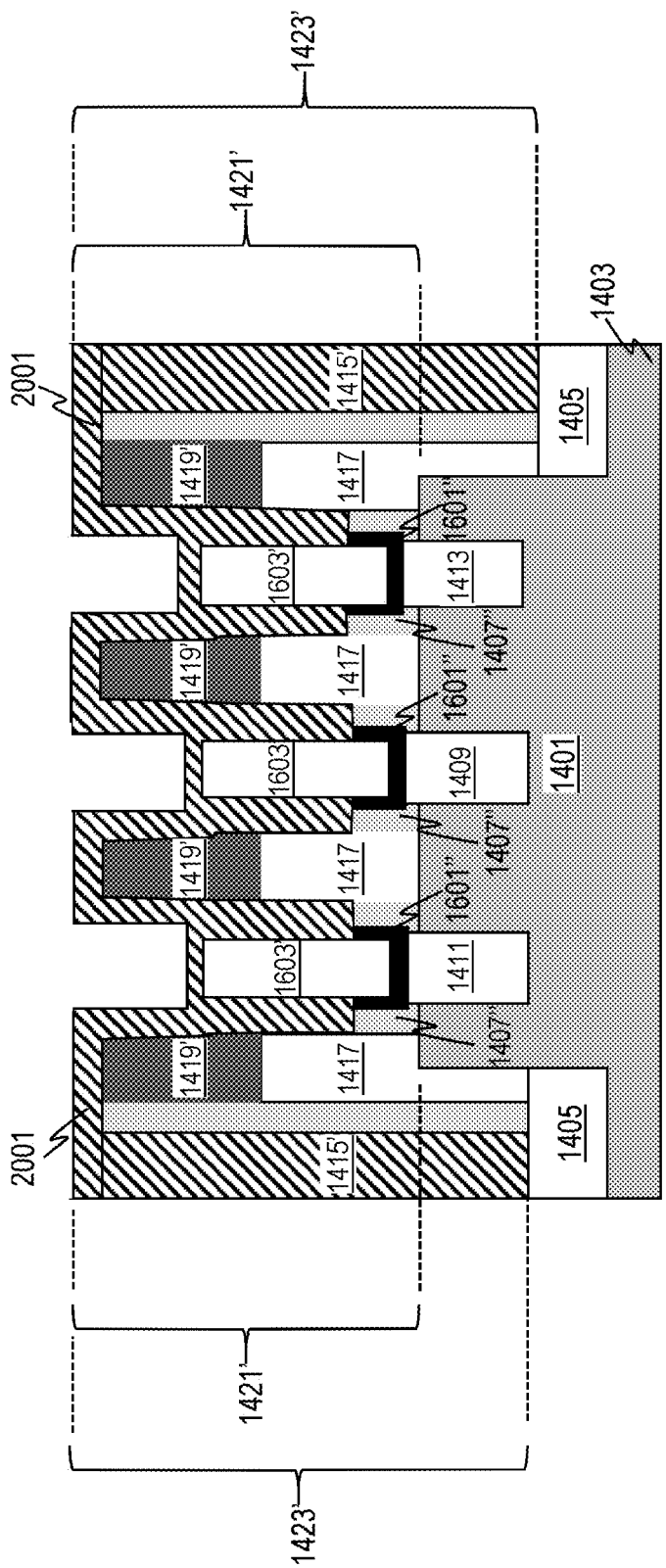
Figure 21:
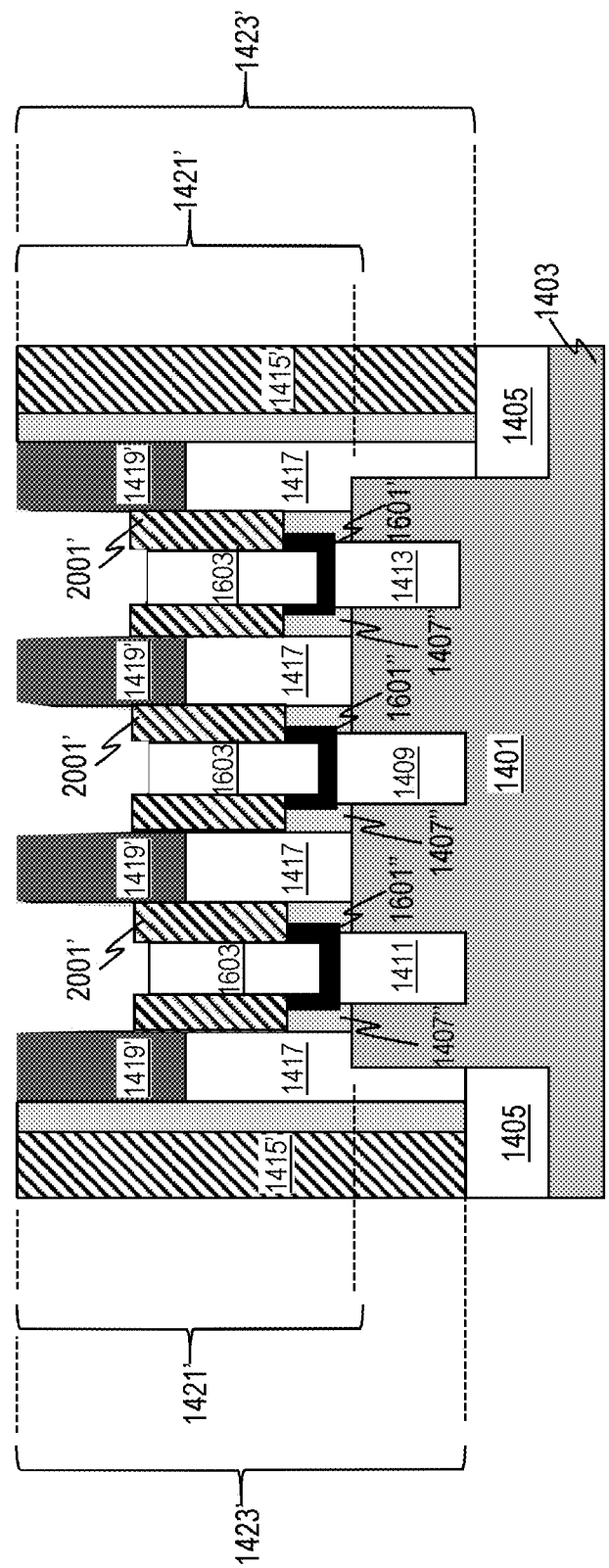
Figure 22:
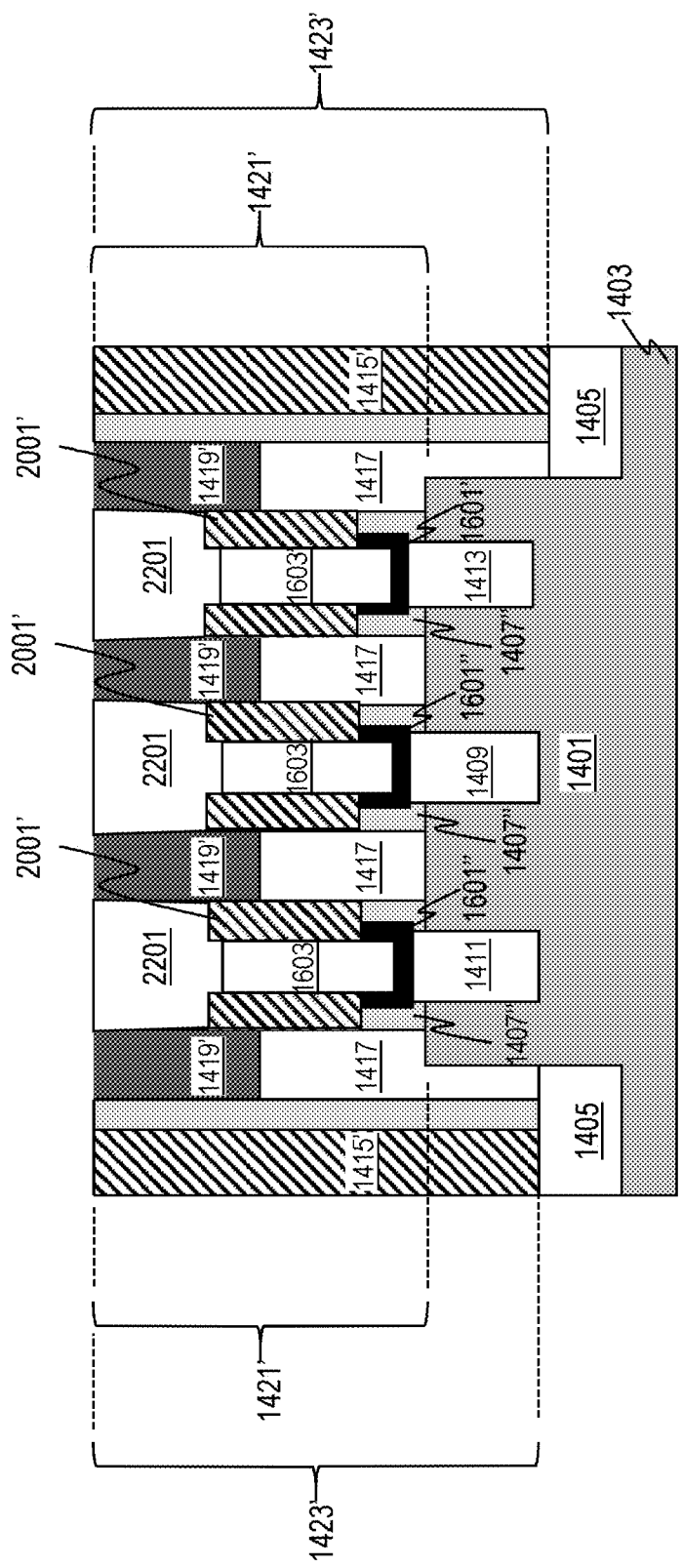

Referring to FIG. 20, an ILD 2001 is conformally formed, e.g., of oxide, SiCOH, SiO$_2$, SiOC, SiN or a similar material, to a thickness, e.g., of about 5 nm to about 30 nm, over the substrate 1403. Thereafter, portions of ILD 2001 are removed, e.g., by an isotropic etching process, forming ILD 2001' between gate structures and metal layer 1603', as depicted in FIG. 21. Subsequently, a SiC layer 2201 is formed over ILD 2001' and metal layer 1603', such that the upper surface of SiC layer 2201 is substantially coplanar with the upper surface of first gate structures 1421' and second gate structures 1423', as illustrated in FIG. 22.

Figure 23:
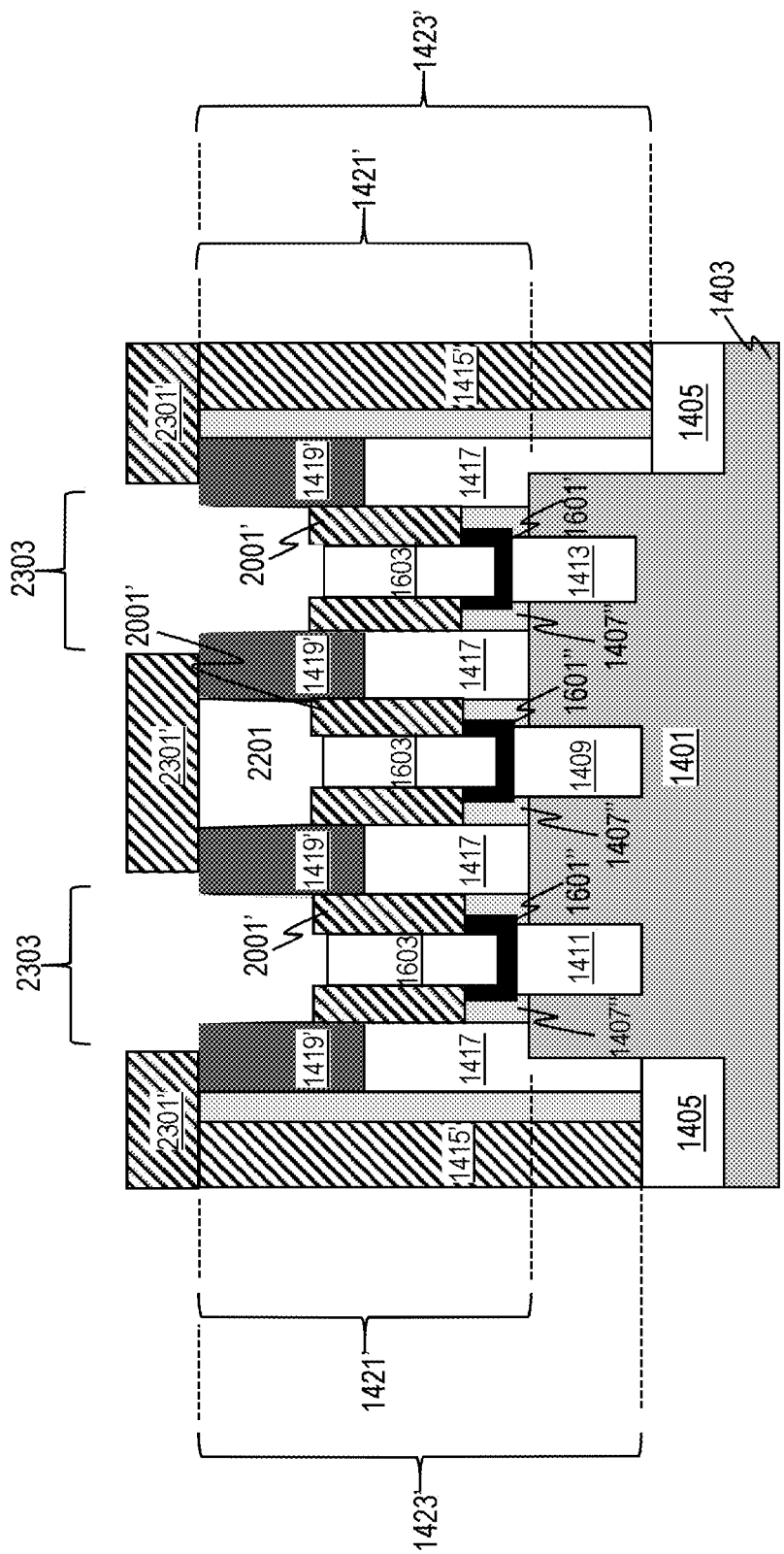
Figure 25:
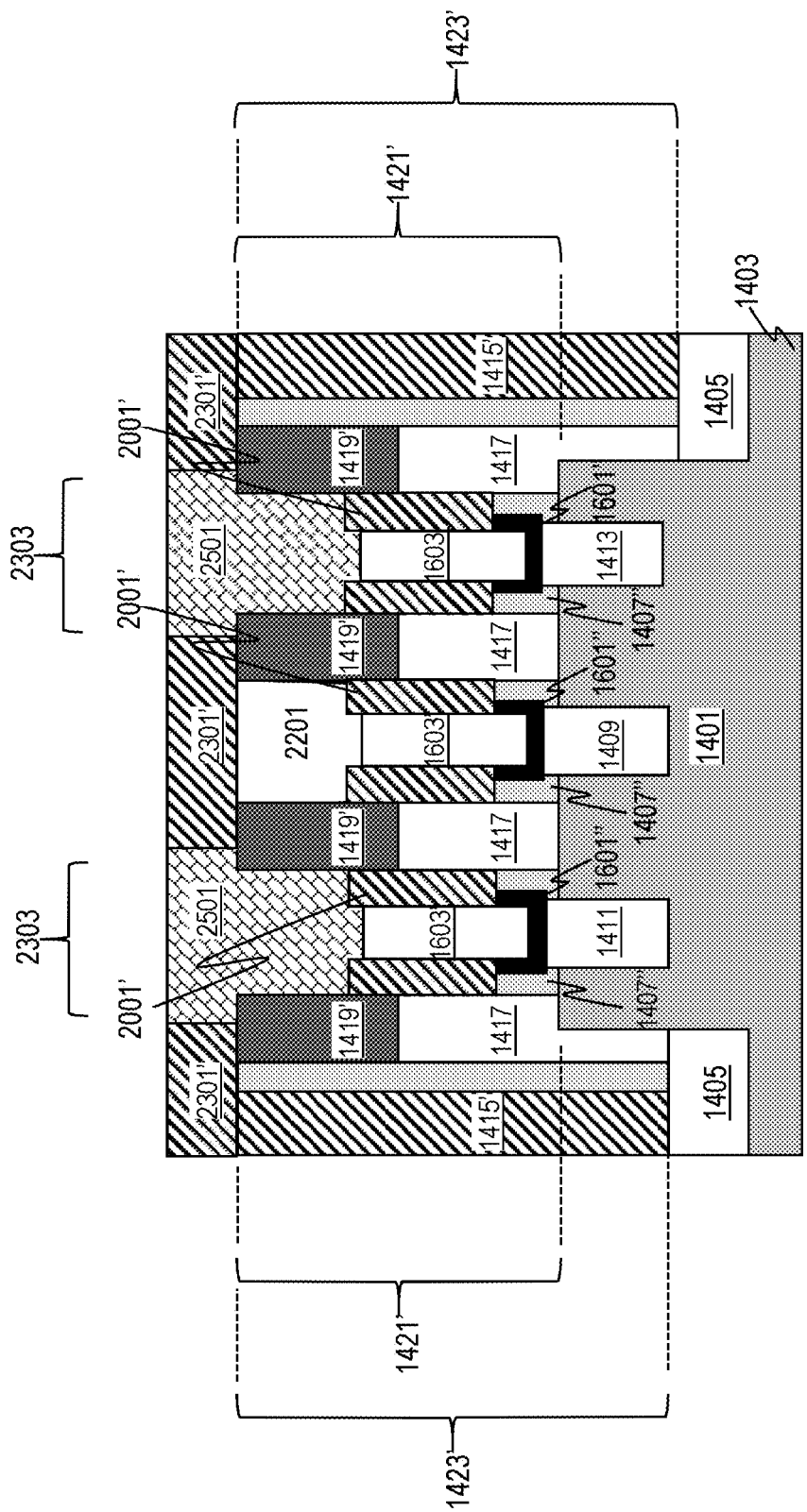

Thereafter, in FIG. 23, an ILD 2301 is formed over substrate 1403. Subsequently, ILD 2301 is etched exposing SiC layer 2201 over RSDs 1411 and 1413, forming ILD 2301'. Subsequently, the exposed SiC layer 2201 over RSDs 1411 and 1413 is removed, forming trenches 2303. As shown in FIG. 25, trenches 2303 are filled with metal layer 2501, e.g., Co, W, or Ru, or a similar material, forming a CA to RSDs 1411 and 1413. The upper surface of metal layer 2501 is substantially coplanar to the upper surface of ILD 2301'.

Figure 24:
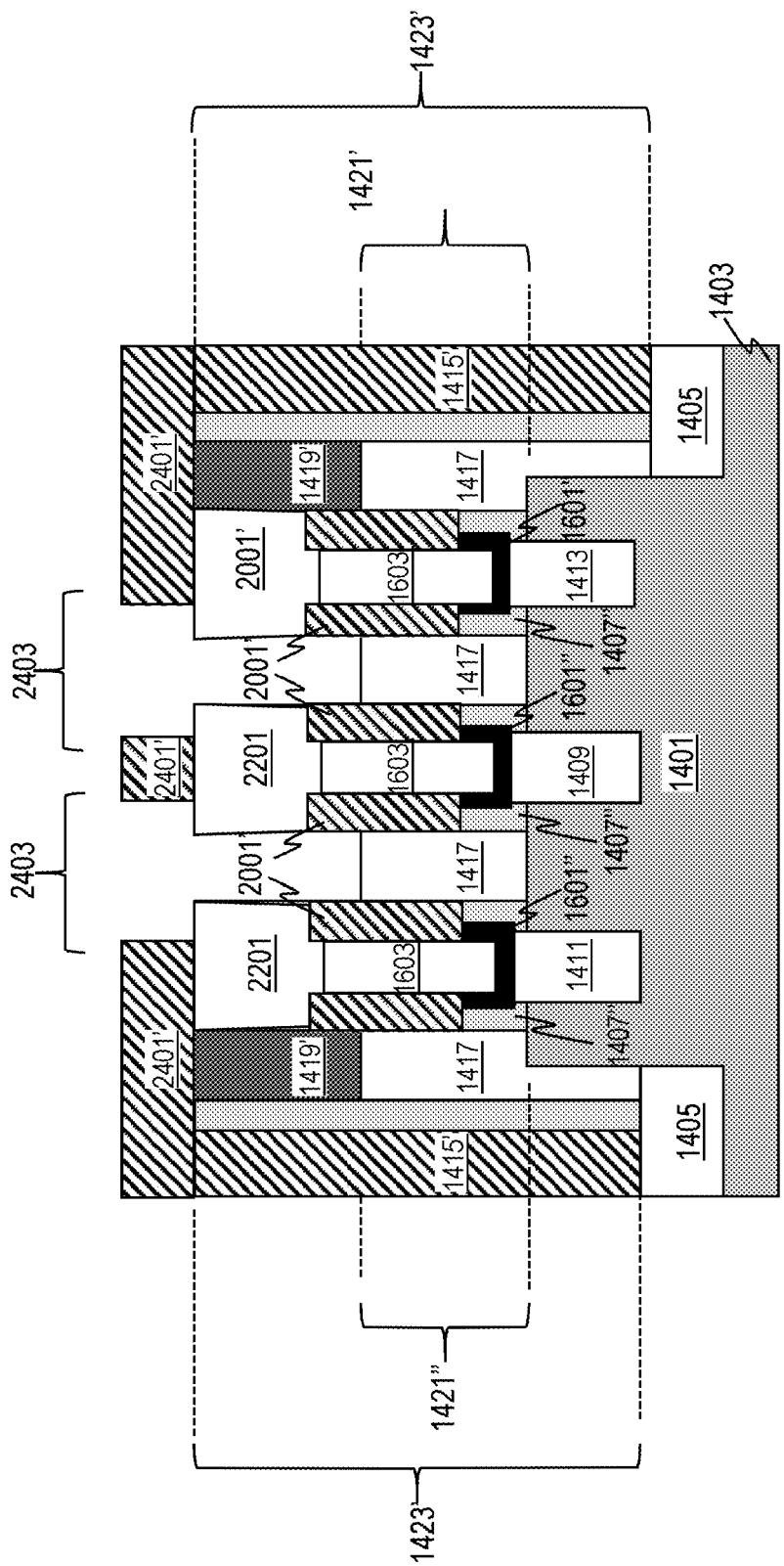
Figure 26:
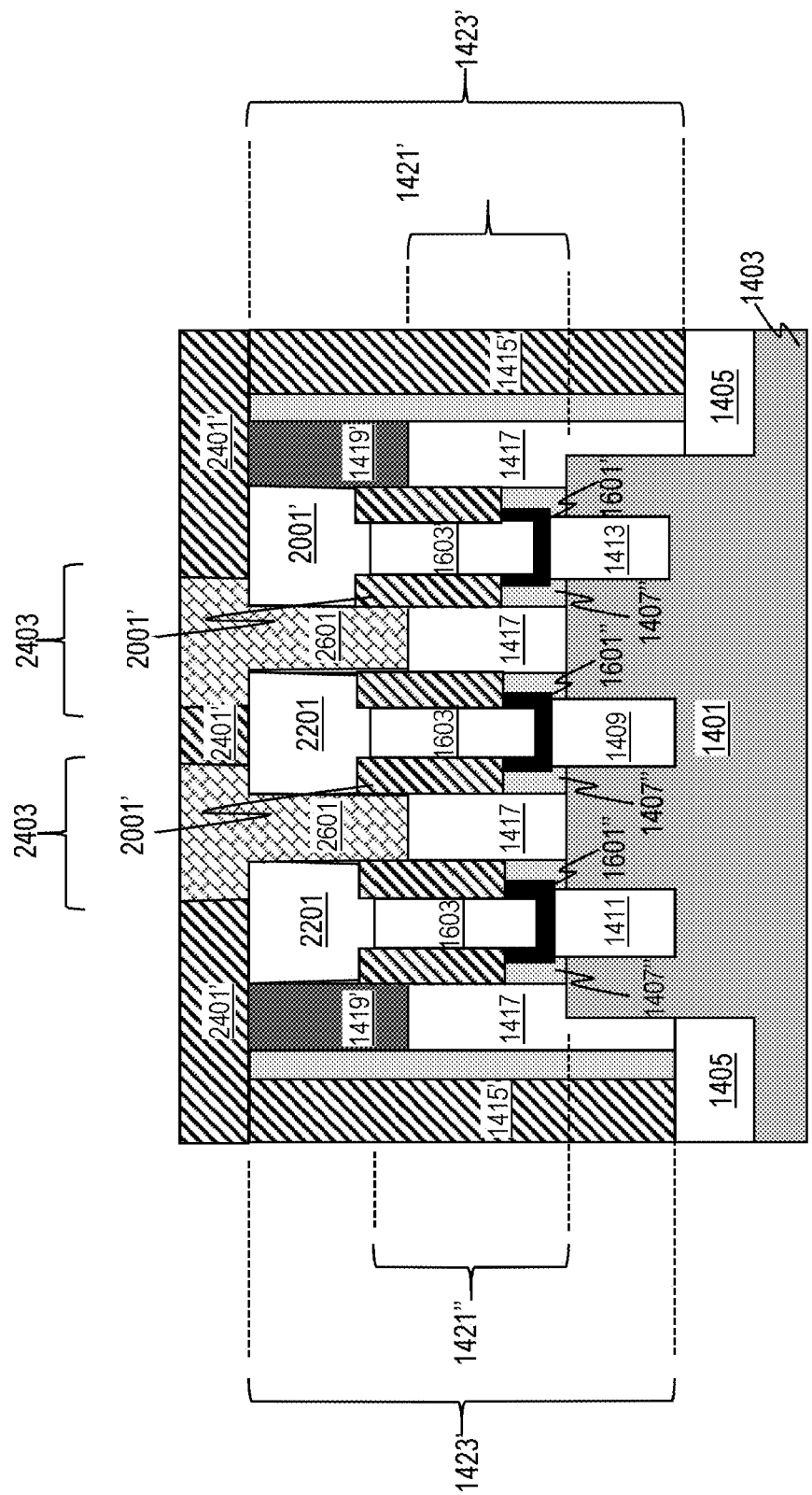

As shown in FIG. 24, an ILD 2401 is formed over substrate 1403. Subsequently, ILD 2401 is etched exposing first gate structures 1421', forming ILD 2401'. Thereafter, cap layer 1419' of the first gate structures 1421' is removed, forming trenches 2403 and first gate structures 1421". As shown in FIG. 26, trenches 2403 are filled with metal layer 2601, e.g., Co, W, or Ru, or a similar material, forming a CB to gate structures 1421". The upper surface of metal layer 2601 is substantially coplanar with the upper surface of ILD 2401'.

The embodiments of the present disclosure can achieve several technical effects, such as such as robust and compatible integration scheme to make COAG, a significant reduction in effective capacitance ($C_{eff}$), and higher yield and improved device performance. Devices formed in accordance with embodiments of the present disclosure enjoy utility in various industrial applications, e.g., microprocessors, smartphones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated finFET semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    first gate structures over a fin of a substrate and second gate structures, each over an outer portion of the fin and a shallow trench isolation (STI) layer adjacent to the fin, wherein the first gate structures comprise: a high-k/metal gate (HKMG) layer; and a sidewall spacer on each sidewall of the HKMG layer, wherein upper surface of the sidewall spacers is substantially coplanar to upper surface of the metal layer;
    a first raised source/drain (RSD) in a portion of the fin between the first gate structures and a second RSD in the portion of the fin between the first and second gate structures;
    a metal liner over the first and second RSD and on sidewall portions of the first and second gate structures;
    a metal layer over the metal liner; and
    an interlayer dielectric (ILD) over the metal liner and portions of the first and second gate structures.

2. The device according to claim 1, wherein the first and second gate structures comprises:
    a high-k/metal gate (HKMG) layer;
    a cap layer over the HKMG layer; and
    a sidewall spacer on each sidewall of the HKMG layer and the cap layer, wherein upper surface of the sidewall spacers adjacent to the first and second RSD is substantially coplanar to upper surface of the metal layer.

3. The device according to claim 2, further comprising:
a silicon carbide (SiC) layer over the sidewall spacers adjacent to the first RSD, and the ILD and the metal layer over the first RSD, wherein upper surface of the SiC layer is substantially coplanar to upper surface of the first gate structures;
a second ILD over the substrate; and
a source/drain contact (CA) through the ILD and in-between the first and second gate structures down to the sidewall spacers adjacent to the second RSD, and the ILD and the metal layer over the second RSD.

4. The device according to claim 2, wherein upper surface of the sidewall spacers adjacent to the first and second RSD is substantially coplanar to upper surface of the metal liner.

5. The device according to claim 1, wherein the second gate structures comprises:
a second high-k/metal gate (HKMG) layer;
a cap layer over the second HKMG layer; and
a second sidewall spacer on each sidewall of the second HKMG layer and the cap layer, wherein upper surface of the second sidewall spacers adjacent to the second RSD is substantially coplanar to upper surface of the metal layer.

6. The device according to claim 5, further comprising:
a silicon carbide (SiC) layer over the sidewall spacers adjacent to the first and second RSD, and the ILD and the metal layer over the first and second RSD, wherein upper surface of the SiC layer is substantially coplanar to upper surface of the second gate structures;
a second ILD over the substrate; and
a gate contact (CB) through the second ILD and over and in-between the SiC layer down to the first gate structures.

7. The device according to claim 5, wherein upper surface of the sidewall spacers and the second sidewall spacers adjacent to the first and second RSD are substantially coplanar to upper surface of the metal liner.

8. The device according to claim 1, wherein the metal liner is formed to a thickness of 1 nanometer (nm) to 15 nm.

9. The device according to claim 1, wherein the metal layer comprises cobalt (Co), tungsten (W) or aluminum (Al).

10. A method comprising:
forming first gate structures over a fin of a substrate and second gate structures, each over an outer portion of the fin and a shallow trench isolation (STI) layer adjacent to the fin;
forming a first raised source/drain (RSD) in a portion of the fin between the first gate structures and a second RSD in the portion of the fin between the first and second gate structures;
forming a metal liner over the first and second RSD and on sidewall portions of the first and second gate structures;
forming a metal layer over the metal liner; and
forming an interlayer dielectric (ILD) over the metal liner and portions of the first and second gate structures, wherein the metal liner and the metal layer are formed by:
 removing portions of the sidewall spacers adjacent to the first and second RSD;
 forming the metal liner on the sidewall spacers adjacent to the first and second RSD and over the first and second RSD;
 forming the metal layer over the metal liner; and
 removing portions of the metal liner and the metal layer, forming a plurality of trenches between the metal layer and the first and second gate structures.

11. The method according to claim 10, wherein the first and second gate structures are formed by:
forming first dummy gates, laterally separated, over the fin of the substrate and second dummy gates, laterally separated, each over the outer portion of the fin and the STI layer adjacent to the fin;
forming a sidewall spacer on each sidewall of the first and second dummy gates;
forming a second ILD over the substrate subsequent to the forming of the first and second RSD;
planarizing the second ILD down to the sidewall spacers;
removing the first and second dummy gates;
forming a high-k/metal gate (HKMG) layer between the sidewall spacers and along a portion of the sidewall spacers; and
forming a cap layer over the HKMG layer between the sidewall spacers and along a remaining portion of the sidewall spacers.

12. The method according to claim 10, further comprising:
forming the ILD in the plurality of trenches;
forming a silicon carbide (SiC) layer over the sidewall spacers adjacent to the first and second RSD, and the ILD and the metal layer over the first and second RSD, wherein upper surface of the SiC layer is substantially coplanar to upper surface of the first and second gate structures;
removing SiC layer over the second RSD; and
forming a source/drain contact (CA) through the second ILD and in-between the first and second gate structures down to the sidewall spacers adjacent to the second RSD, and the ILD and the metal layer over the second RSD.

13. The method according to claim 10, further comprising:
forming the ILD in the plurality of trenches;
forming a silicon carbide (SiC) layer over the sidewall spacers adjacent to the first and second RSD, and the ILD and the metal layer over the first and second RSD, wherein upper surface of the SiC layer is substantially coplanar to upper surface of the first and second gate structures;
removing the cap layer over the HKMG layer of the first gate structures; and
forming a gate contact (CB) through the second ILD and over and in-between the SiC layer down to the HKMG layer of the first gate structures.

14. The method according to claim 10, wherein upper surface of the sidewall spacers adjacent to the first and second RSD is substantially coplanar to upper surface of the metal liner.

15. A device comprising:
first gate structures over a fin of a substrate and second gate structures, each over an outer portion of the fin and a shallow trench isolation (STI) layer adjacent to the fin;
a first raised source/drain (RSD) in a portion of the fin between the first gate structures and a second RSD in the portion of the fin between the first and second gate structures;
a metal liner formed to a thickness of 1 nm to 15 nm over the first and second RSD and on sidewall portions of the first and second gate structures;

a metal layer comprising cobalt (Co), tungsten (W) or aluminum (Al) and formed to a thickness of 5 nm to 100 nm over the metal liner;

an interlayer dielectric (ILD) formed to a thickness of 10 nm to 30 nm over the metal liner and portions of the first and second gate structures;

a silicon carbide (SiC) layer over the sidewall spacers adjacent to the first RSD, and the ILD and the metal layer over the first RSD, wherein upper surface of the SiC layer is substantially coplanar to upper surface of the first gate structures;

a second ILD over the substrate; and a source/drain contact (CA) through the ILD and in-between the first and second gate structures down to the sidewall spacers adjacent to the second RSD, and the ILD and the metal layer over the second RSD.

16. The device according to claim 15, wherein upper surface of the sidewall spacers adjacent to the first and second RSD is substantially coplanar to upper surface of the metal liner.

\* \* \* \* \*